(12) United States Patent
Chung et al.

(10) Patent No.: US 12,477,783 B2
(45) Date of Patent: Nov. 18, 2025

(54) GATE-ALL-AROUND STRUCTURE WITH SELF SUBSTRATE ISOLATION AND METHODS OF FORMING THE SAME

(71) Applicant: Taiwan Semiconductor Manufacturing Co., Ltd., Hsinchu (TW)

(72) Inventors: Cheng-Ting Chung, Hsinchu (TW); Ching-Wei Tsai, Hsinchu (TW); Kuan-Lun Cheng, Hsin-Chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/745,704

(22) Filed: Jun. 17, 2024

(65) Prior Publication Data

US 2024/0339545 A1    Oct. 10, 2024

Related U.S. Application Data

(60) Continuation of application No. 17/498,093, filed on Oct. 11, 2021, now Pat. No. 12,046,681, which is a
(Continued)

(51) Int. Cl.
| | |
|---|---|
| H10D 30/67 | (2025.01) |
| H10D 30/01 | (2025.01) |
| H10D 30/62 | (2025.01) |
| H10D 62/10 | (2025.01) |
| H10D 64/01 | (2025.01) |

(52) U.S. Cl.
CPC ....... *H10D 30/6757* (2025.01); *H10D 30/026* (2025.01); *H10D 30/62* (2025.01); *H10D 30/6735* (2025.01); *H10D 62/105* (2025.01); *H10D 64/017* (2025.01)

(58) Field of Classification Search
None
See application file for complete search history.

(56) References Cited

U.S. PATENT DOCUMENTS

| 8,772,109 B2 | 7/2014 | Colinge |
| 8,785,285 B2 | 7/2014 | Tsai |
| (Continued) | | |

*Primary Examiner* — Michelle Mandala
(74) *Attorney, Agent, or Firm* — HAYNES AND BOONE, LLP

(57) ABSTRACT

Semiconductor device and the manufacturing method thereof are disclosed. An exemplary semiconductor device comprises a fin substrate having a first dopant concentration; an anti-punch through (APT) layer disposed over the fin substrate, wherein the APT layer has a second dopant concentration that is greater than the first dopant concentration; a nanostructure including semiconductor layers disposed over the APT layer; a gate structure disposed over the nanostructure and wrapping each of the semiconductor layers, wherein the gate structure includes a gate dielectric and a gate electrode; a first epitaxial source/drain (S/D) feature and a second epitaxial S/D feature disposed over the APT layer, wherein the gate structure is disposed between the first epitaxial S/D feature and the second epitaxial S/D feature; and an isolation layer disposed between the APT layer and the fin substrate, wherein a material of the isolation layer is the same as a material of the gate dielectric.

20 Claims, 18 Drawing Sheets

Related U.S. Application Data division of application No. 16/583,449, filed on Sep. 26, 2019, now Pat. No. 11,145,765.

(56) References Cited

U.S. PATENT DOCUMENTS

| | | |
|---|---|---|
| 8,816,444 B2 | 8/2014 | Wann |
| 8,823,065 B2 | 9/2014 | Wang |
| 8,860,148 B2 | 10/2014 | Hu |
| 9,105,490 B2 | 8/2015 | Wang |
| 9,177,809 B2 | 11/2015 | Sakuma |
| 9,236,267 B2 | 1/2016 | De |
| 9,236,300 B2 | 1/2016 | Liaw |
| 9,520,482 B1 | 12/2016 | Chang |
| 9,576,814 B2 | 2/2017 | Wu |
| 9,608,069 B1 | 3/2017 | Basker |
| 11,024,628 B2 | 6/2021 | Noh |
| 2005/0112851 A1 | 5/2005 | Lee |
| 2016/0111513 A1* | 4/2016 | Liu ..................... H10D 30/014 438/163 |
| 2017/0222024 A1 | 8/2017 | Bergendahl |
| 2019/0067122 A1 | 2/2019 | Cheng |
| 2020/0105759 A1 | 4/2020 | Bowonder |
| 2020/0258785 A1* | 8/2020 | Zhang ................ H10D 30/6757 |
| 2020/0357911 A1 | 11/2020 | Frougier |
| 2021/0082915 A1* | 3/2021 | Bao ..................... H10D 84/853 |
| 2021/0098634 A1 | 4/2021 | Chung |

\* cited by examiner

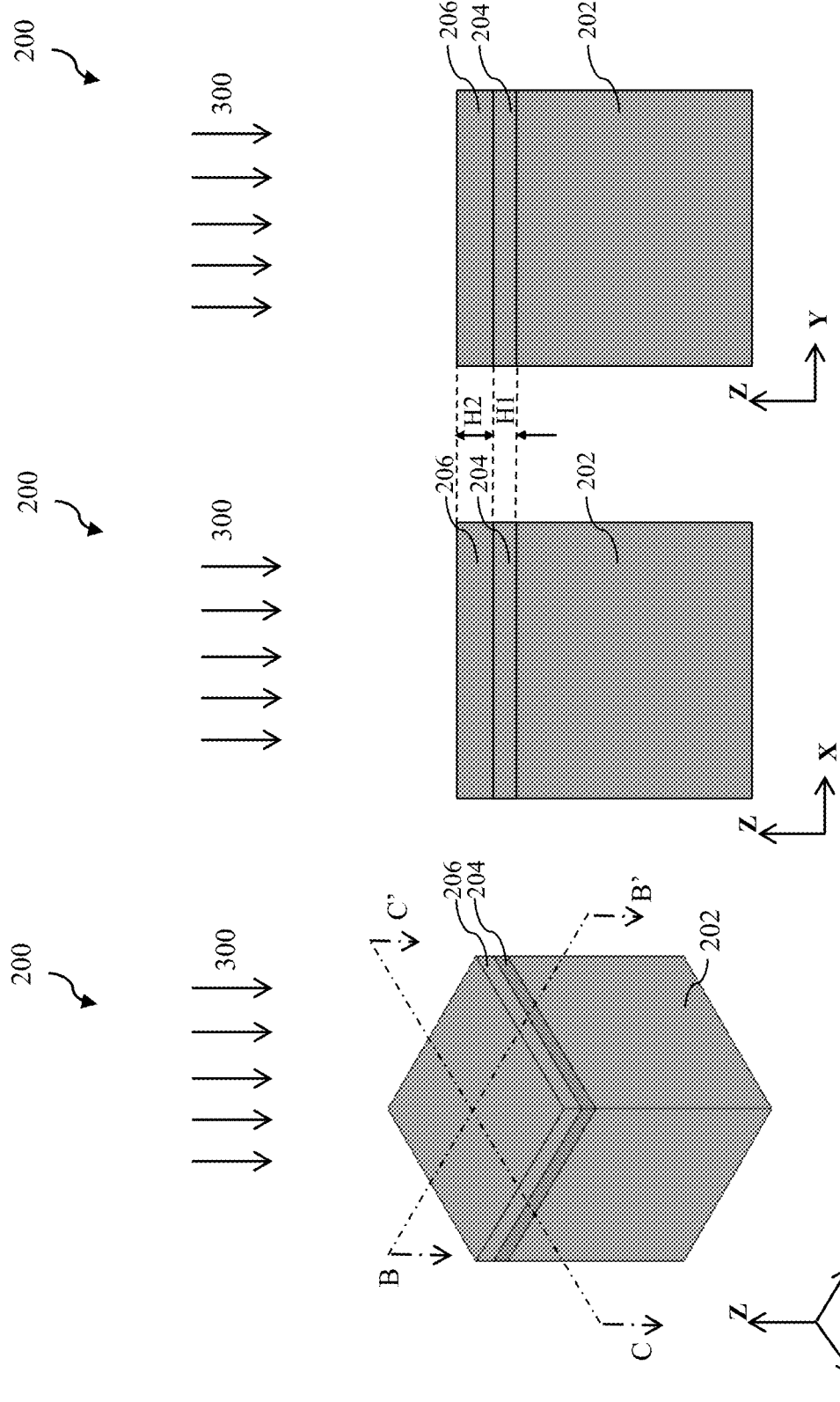

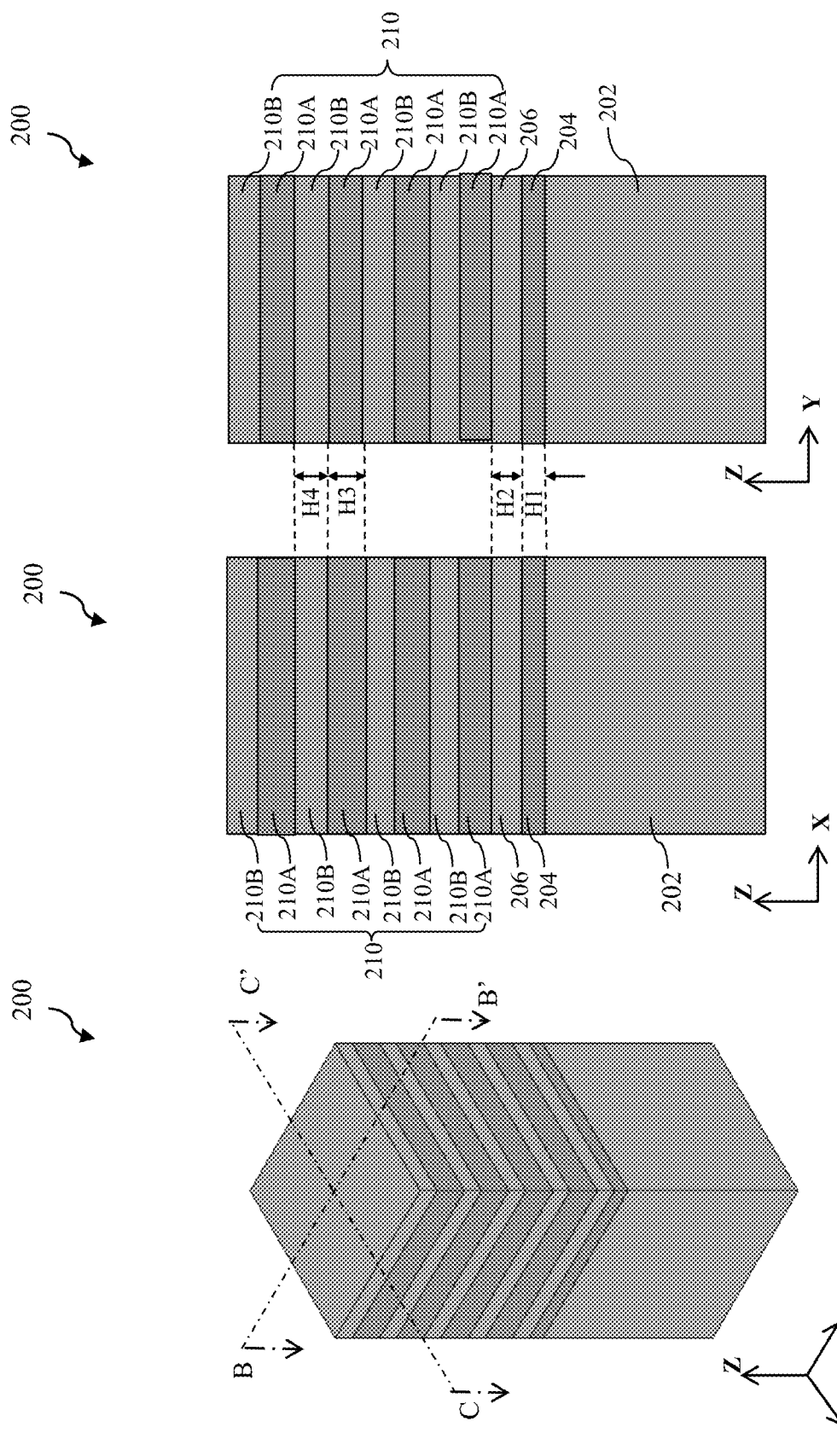

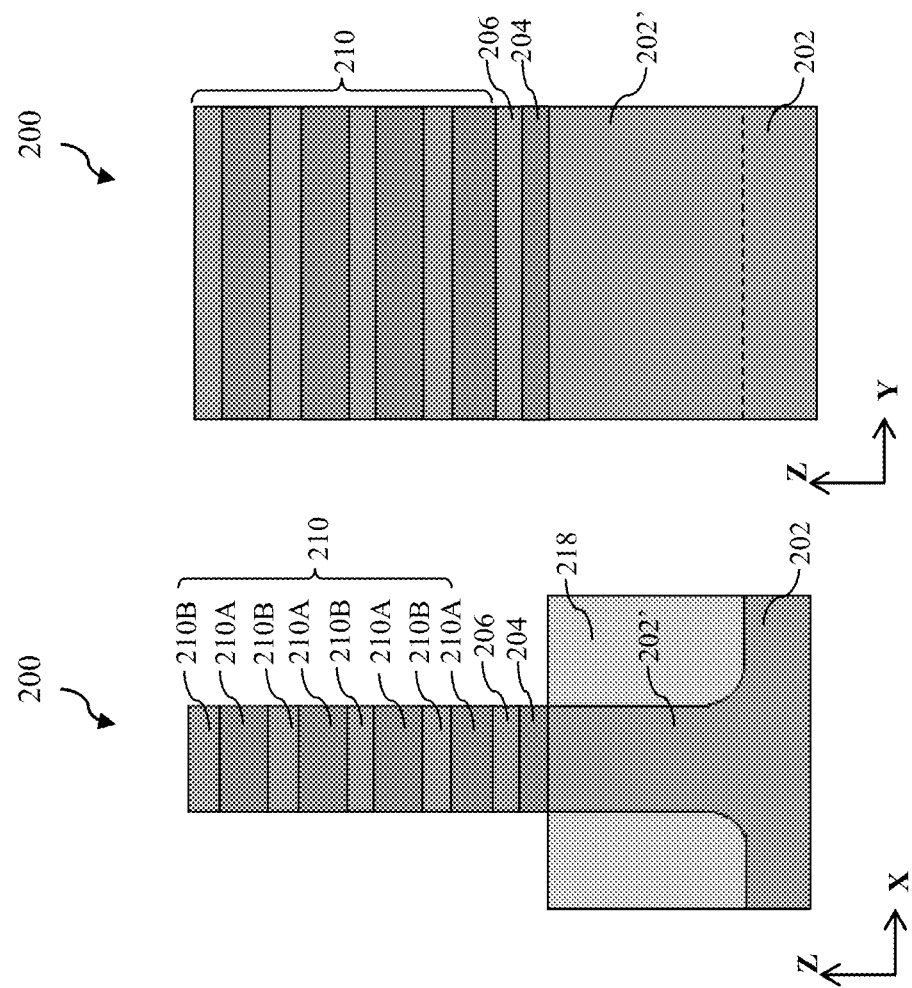
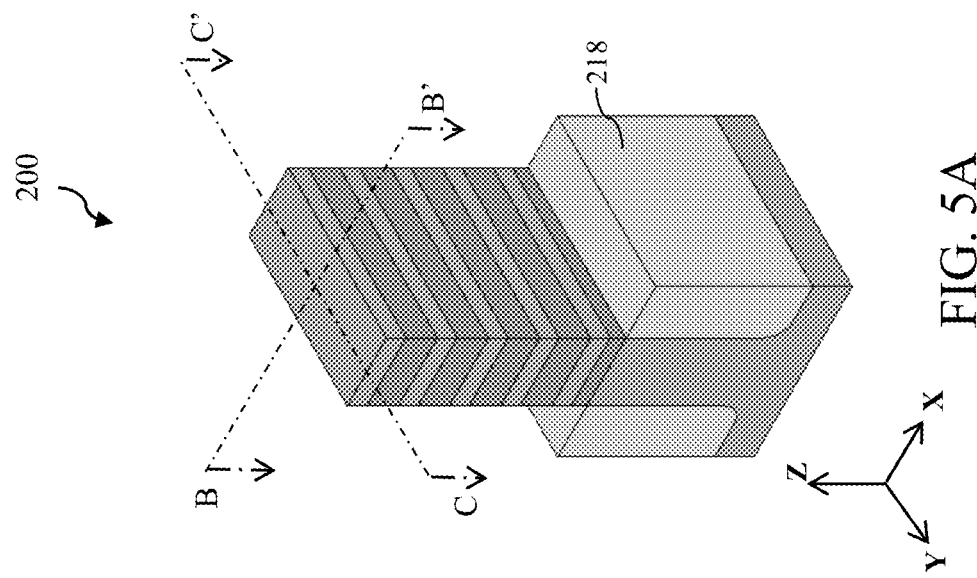
FIG. 5C
FIG. 5B
FIG. 5A

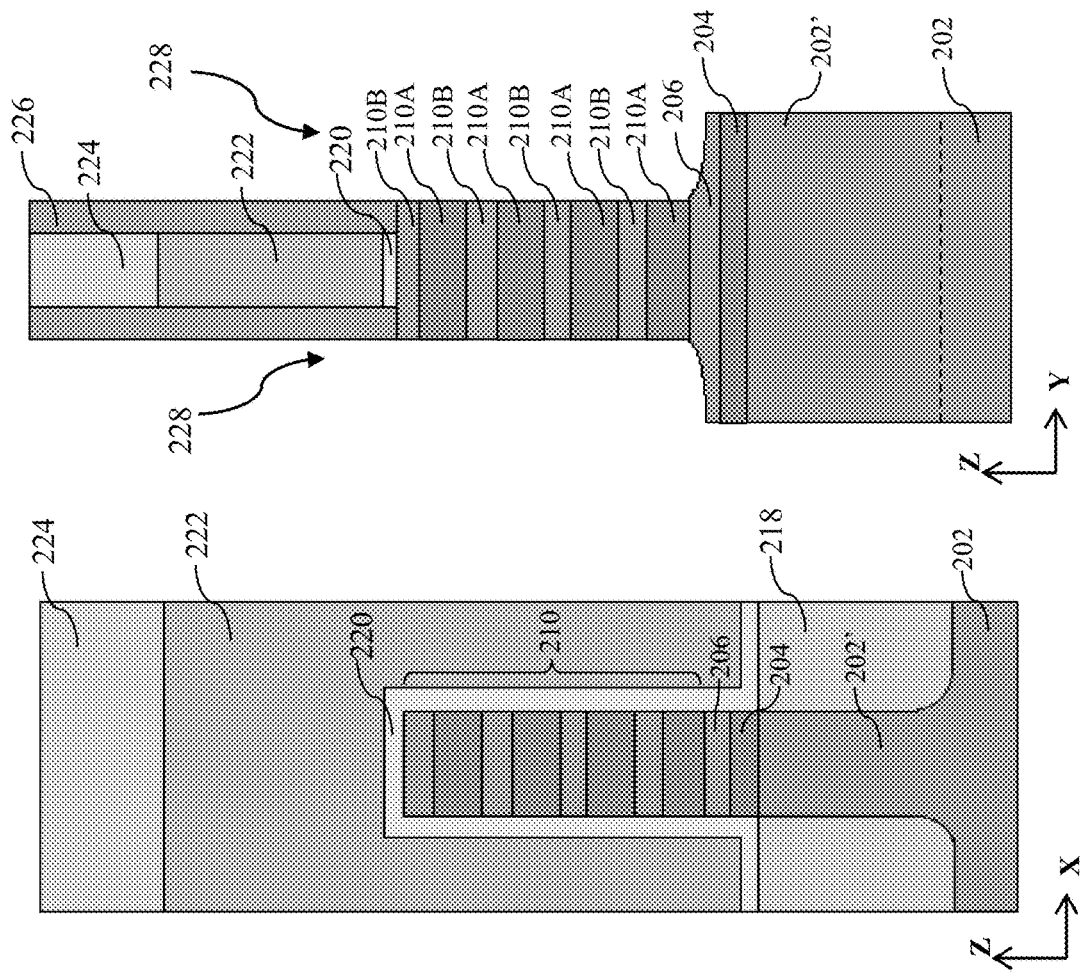
FIG. 9C
FIG. 9B
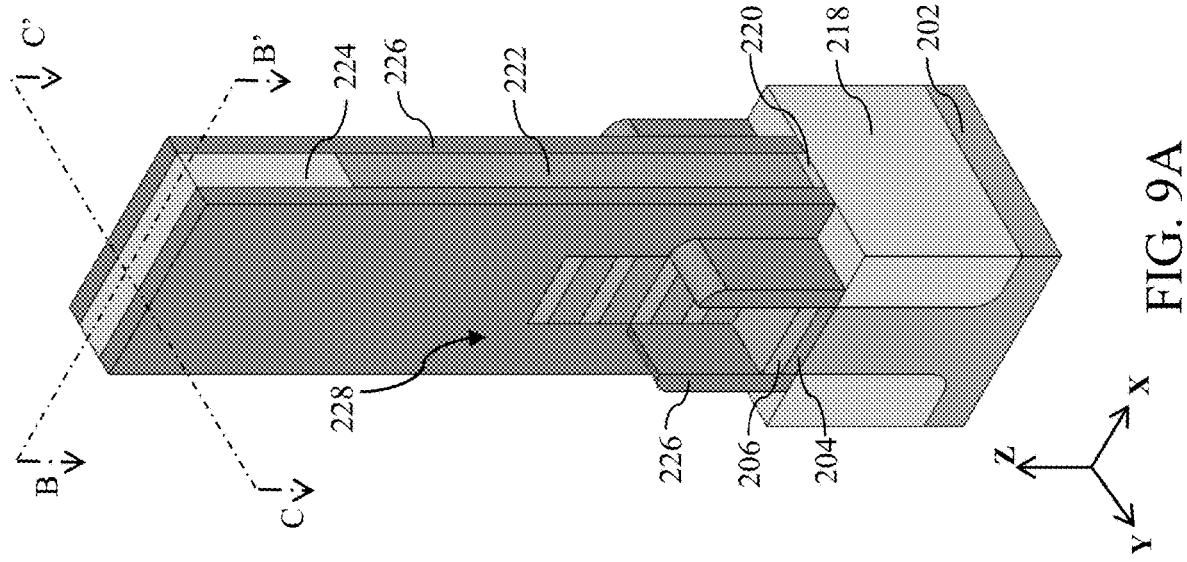
FIG. 9A

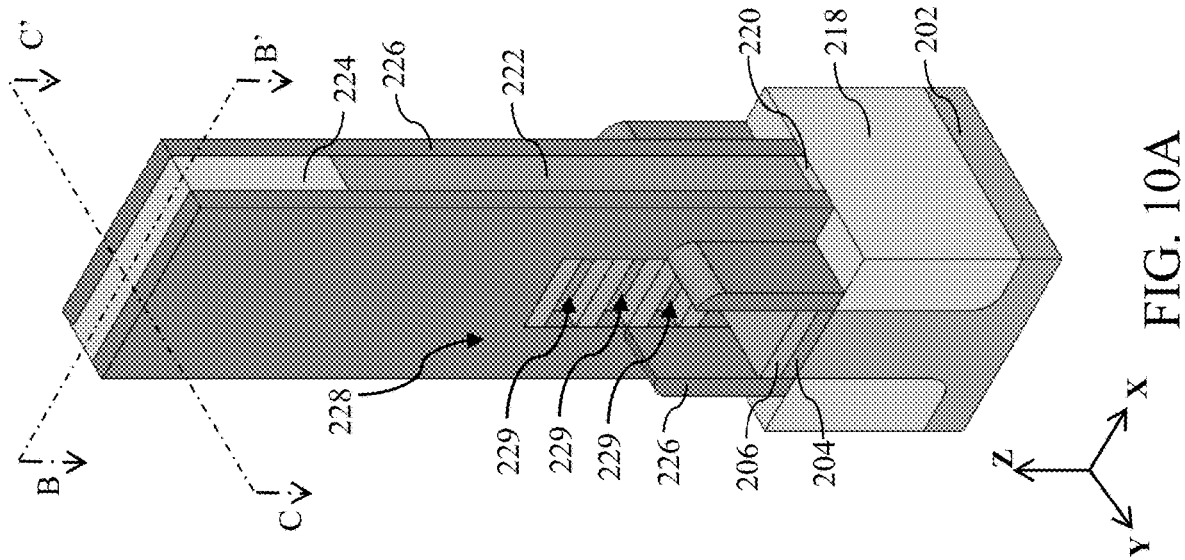
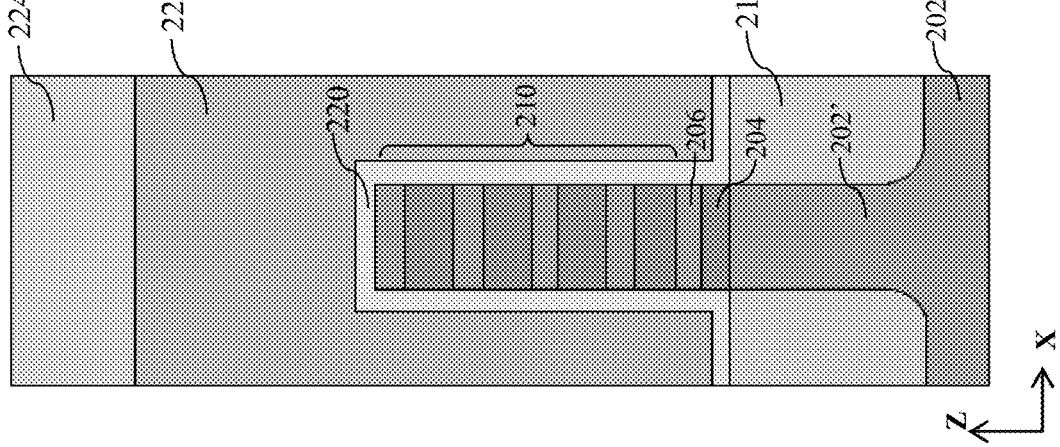
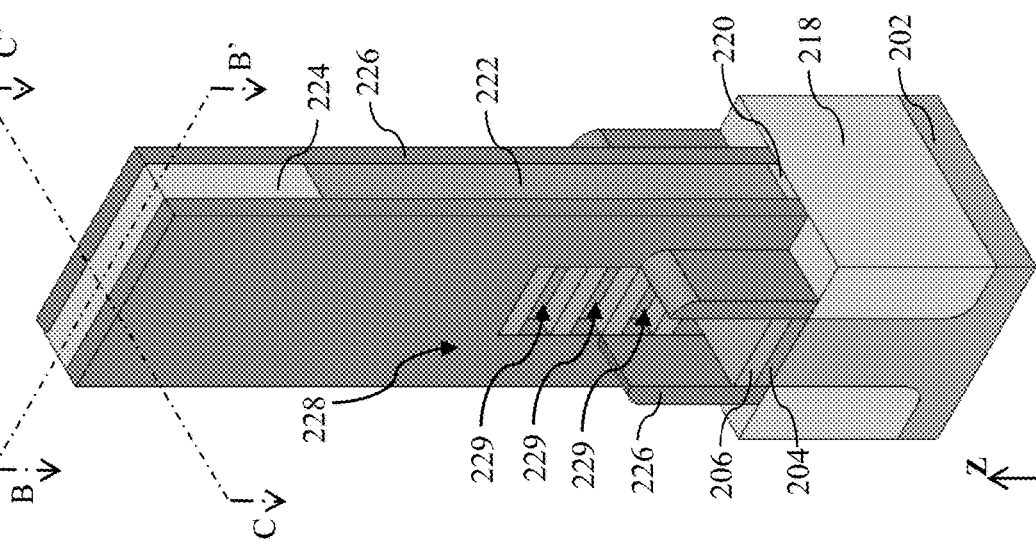
FIG. 10C
FIG. 10B
FIG. 10A

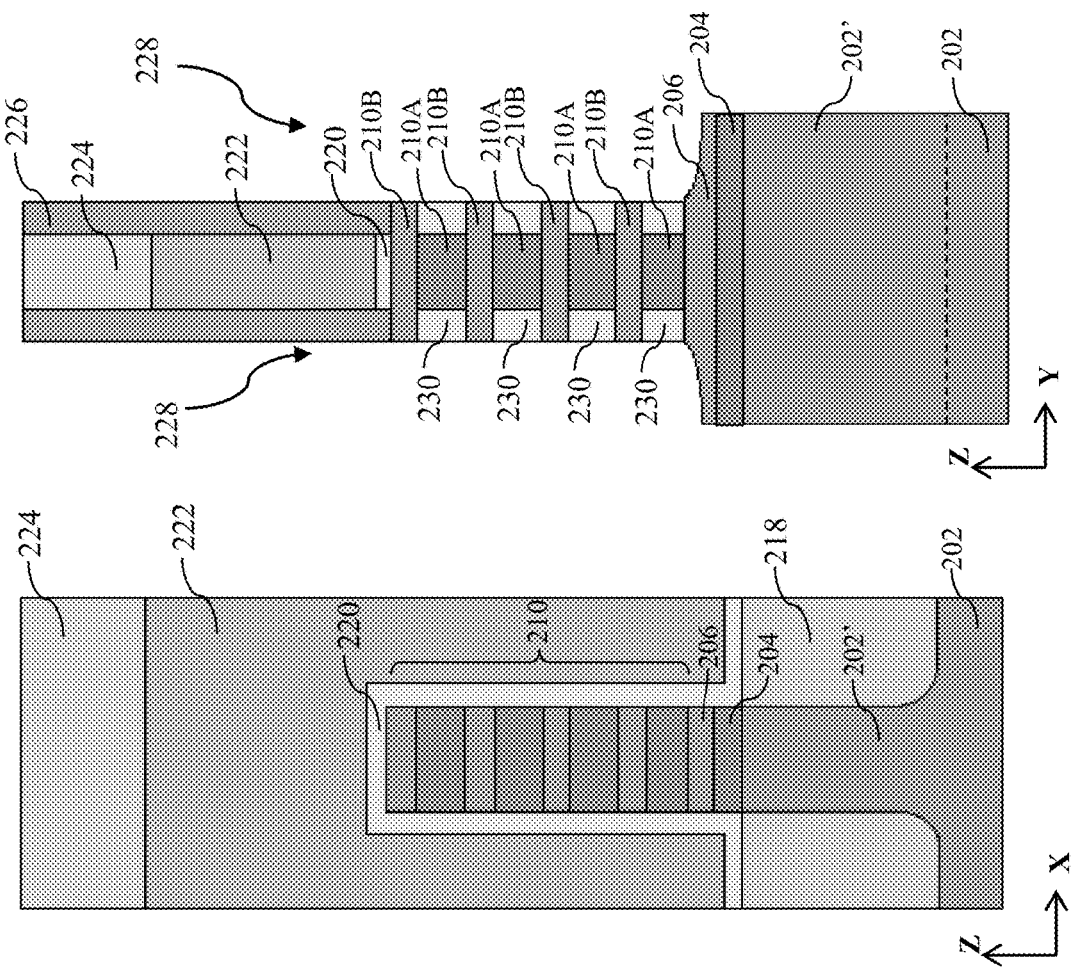
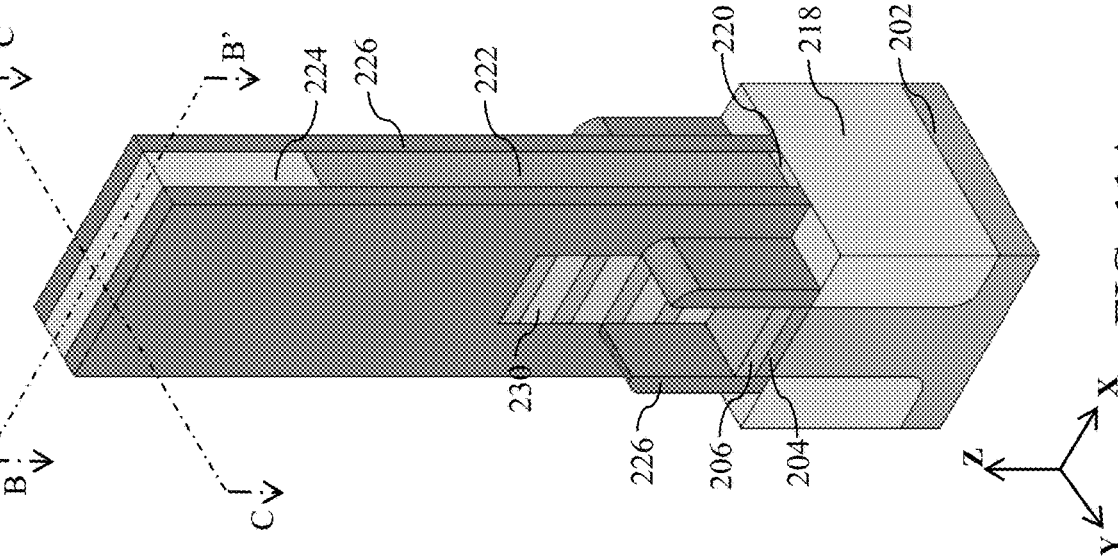
FIG. 11A  FIG. 11B  FIG. 11C

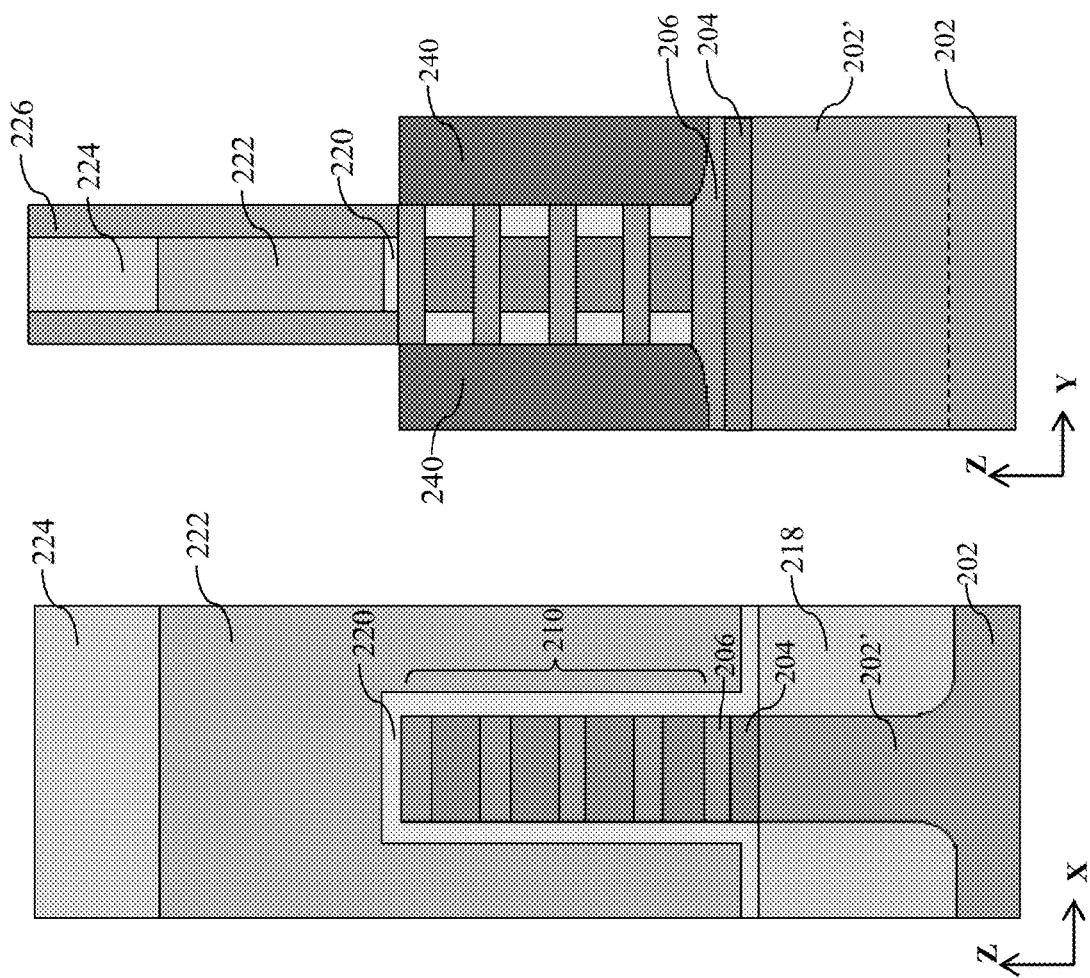
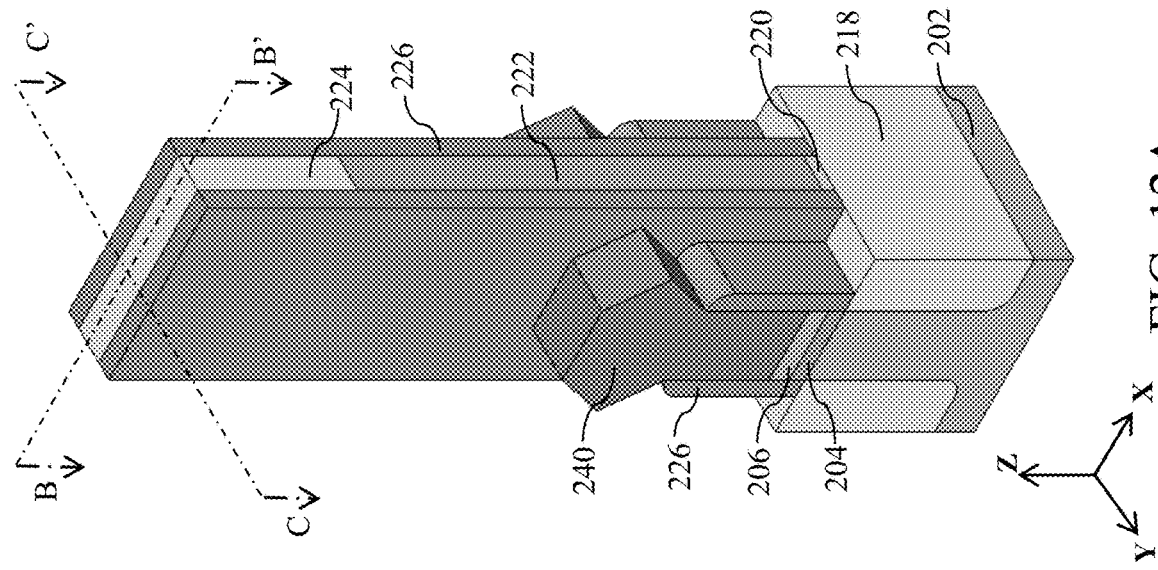
FIG. 12C
FIG. 12B
FIG. 12A

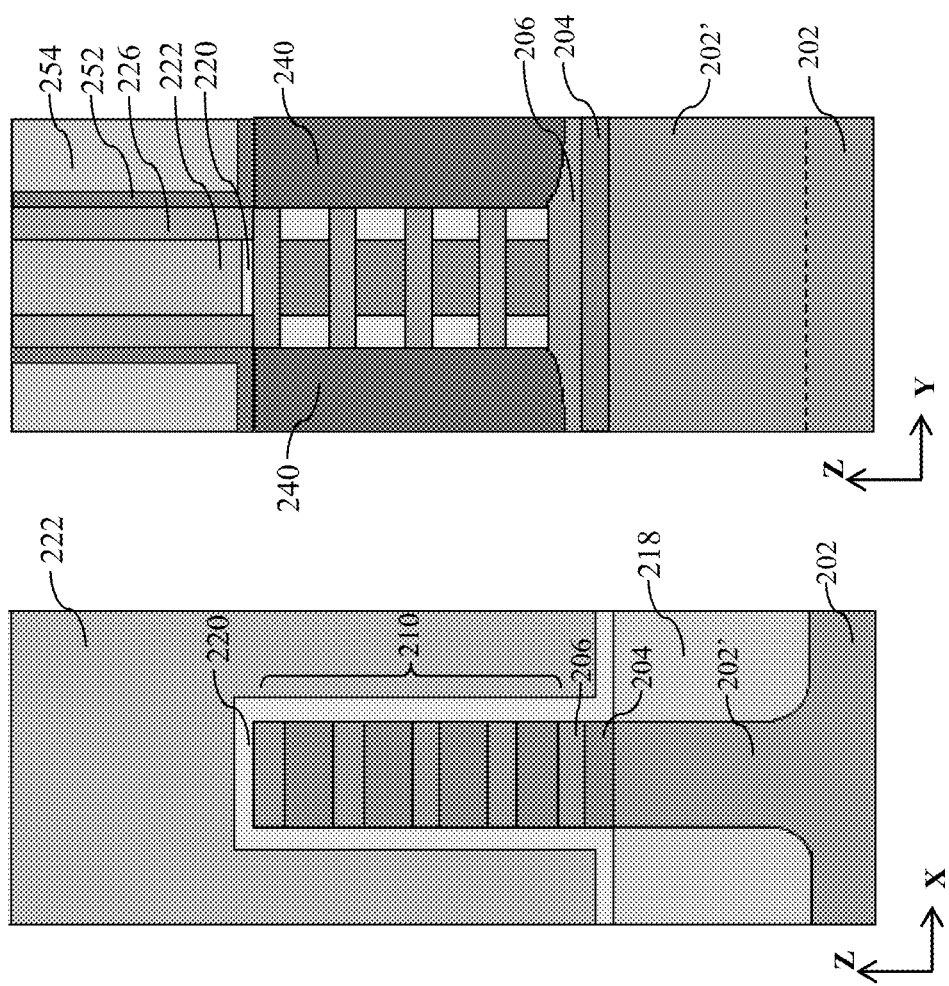
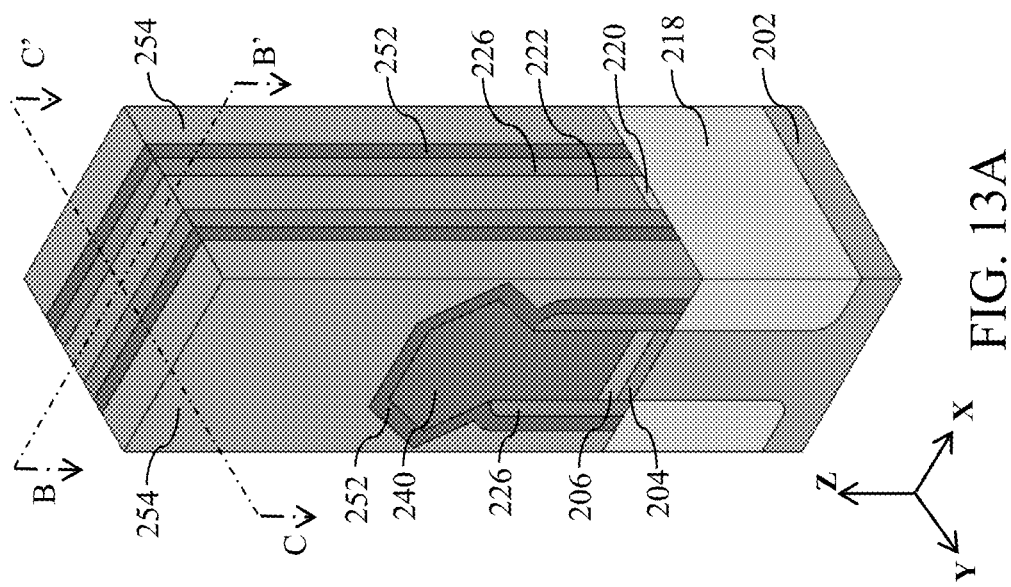
FIG. 13A  FIG. 13B  FIG. 13C

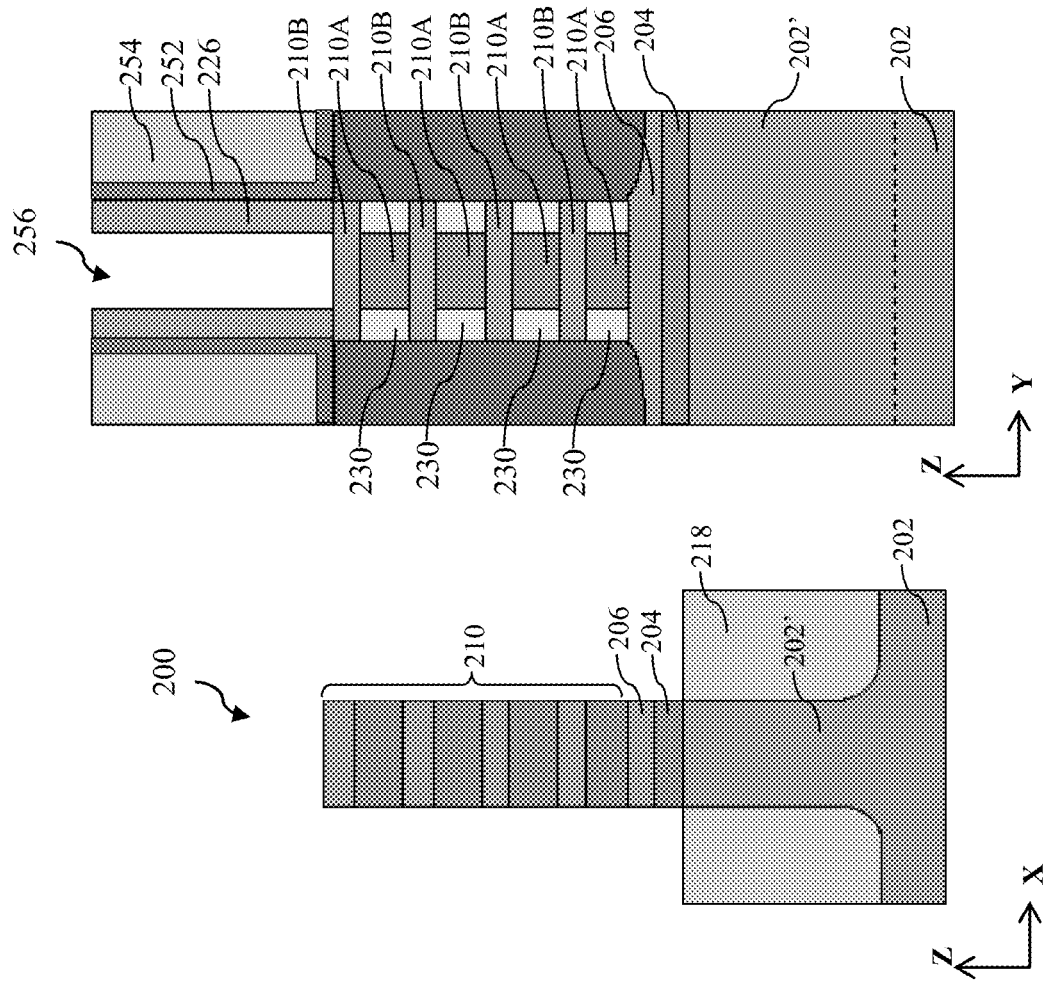
FIG. 14C
FIG. 14B
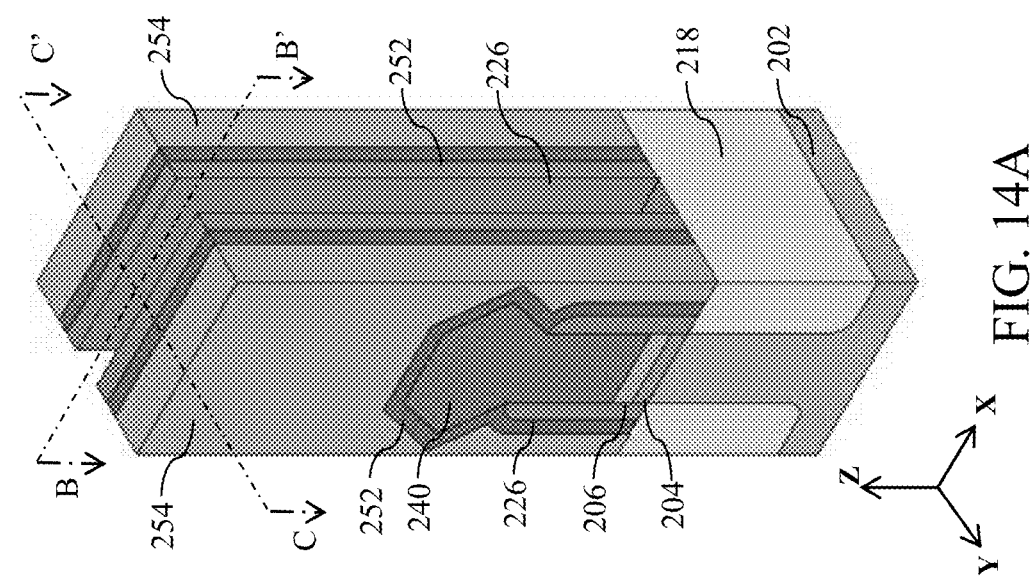
FIG. 14A

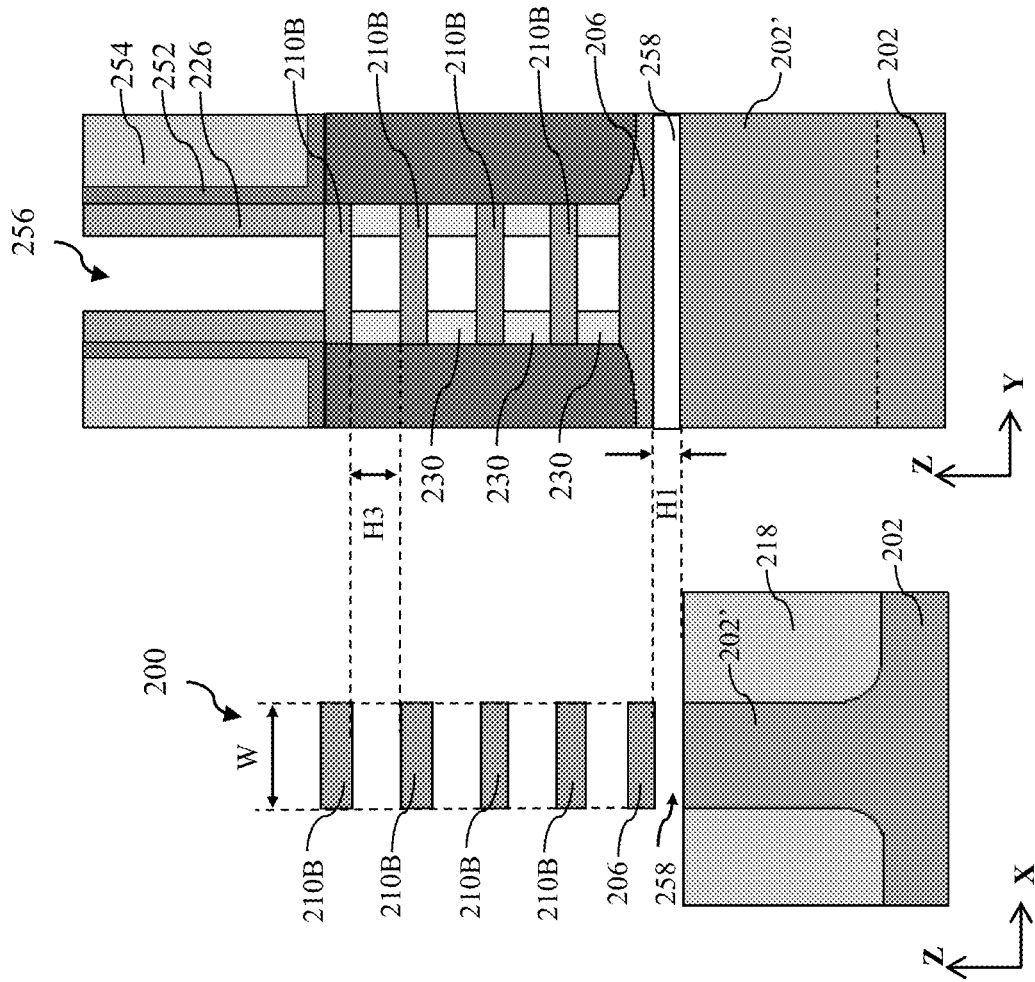
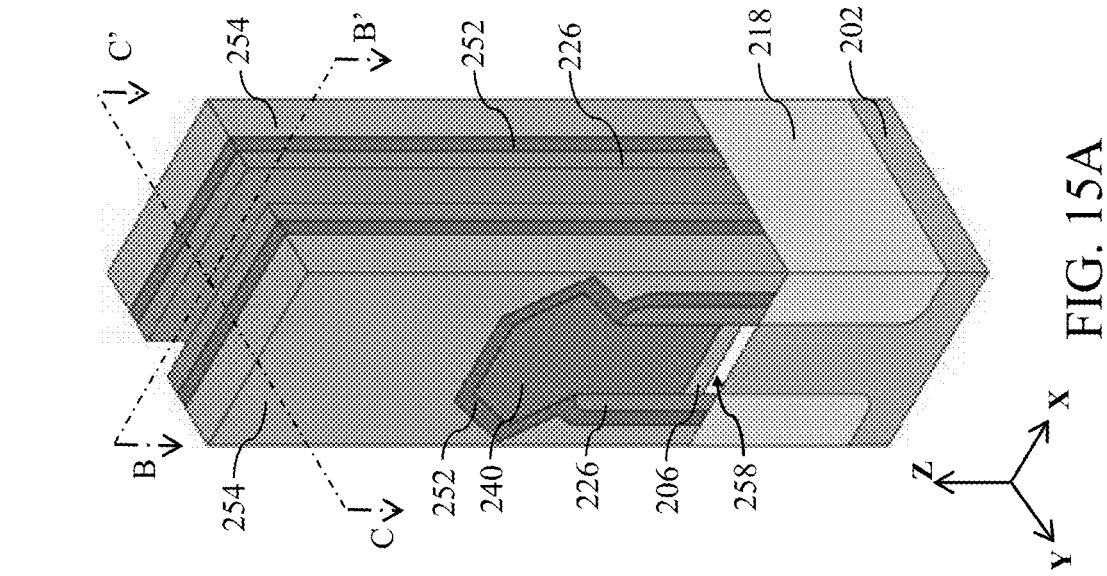
FIG. 15B
FIG. 15C
FIG. 15A

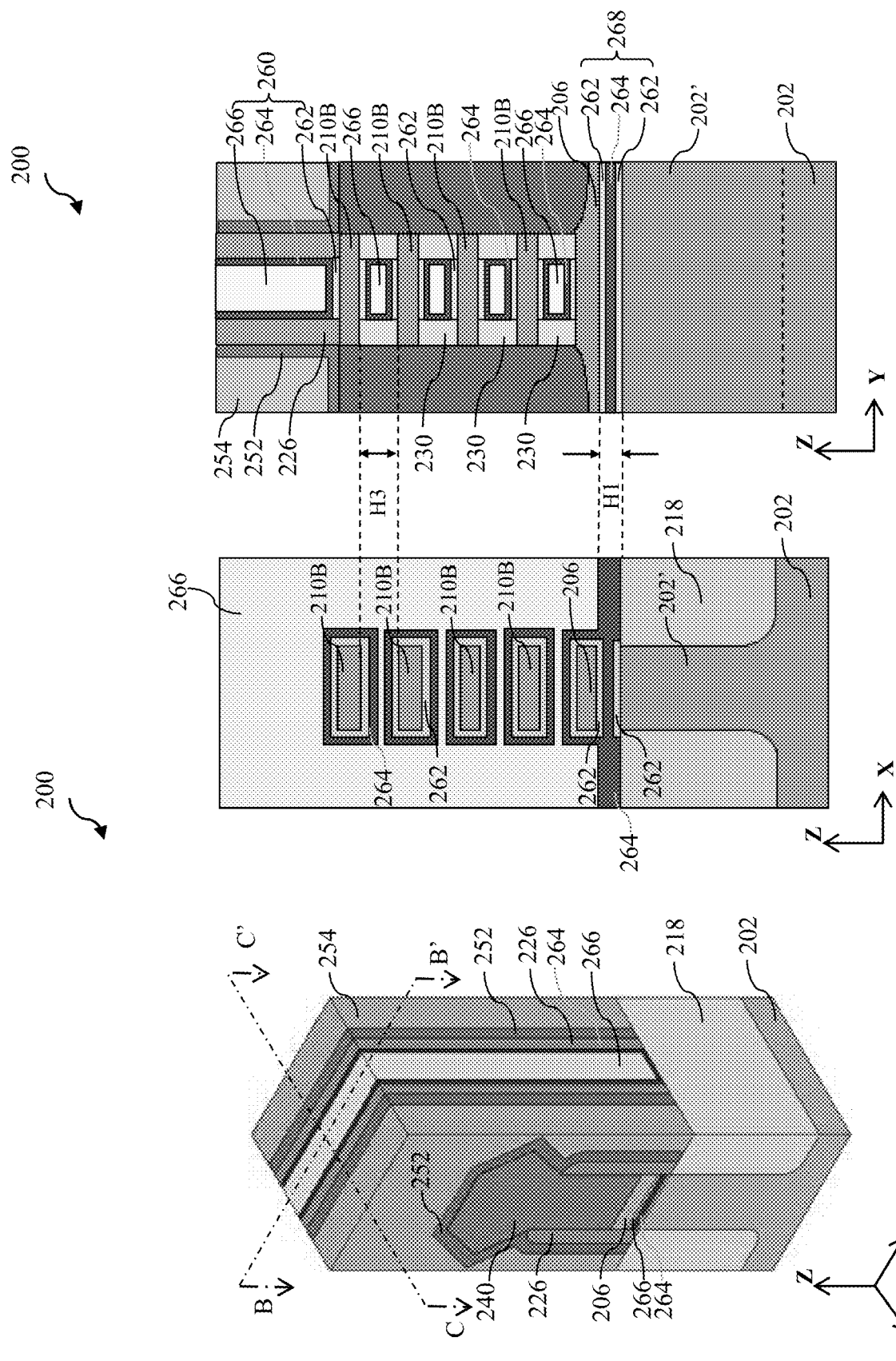

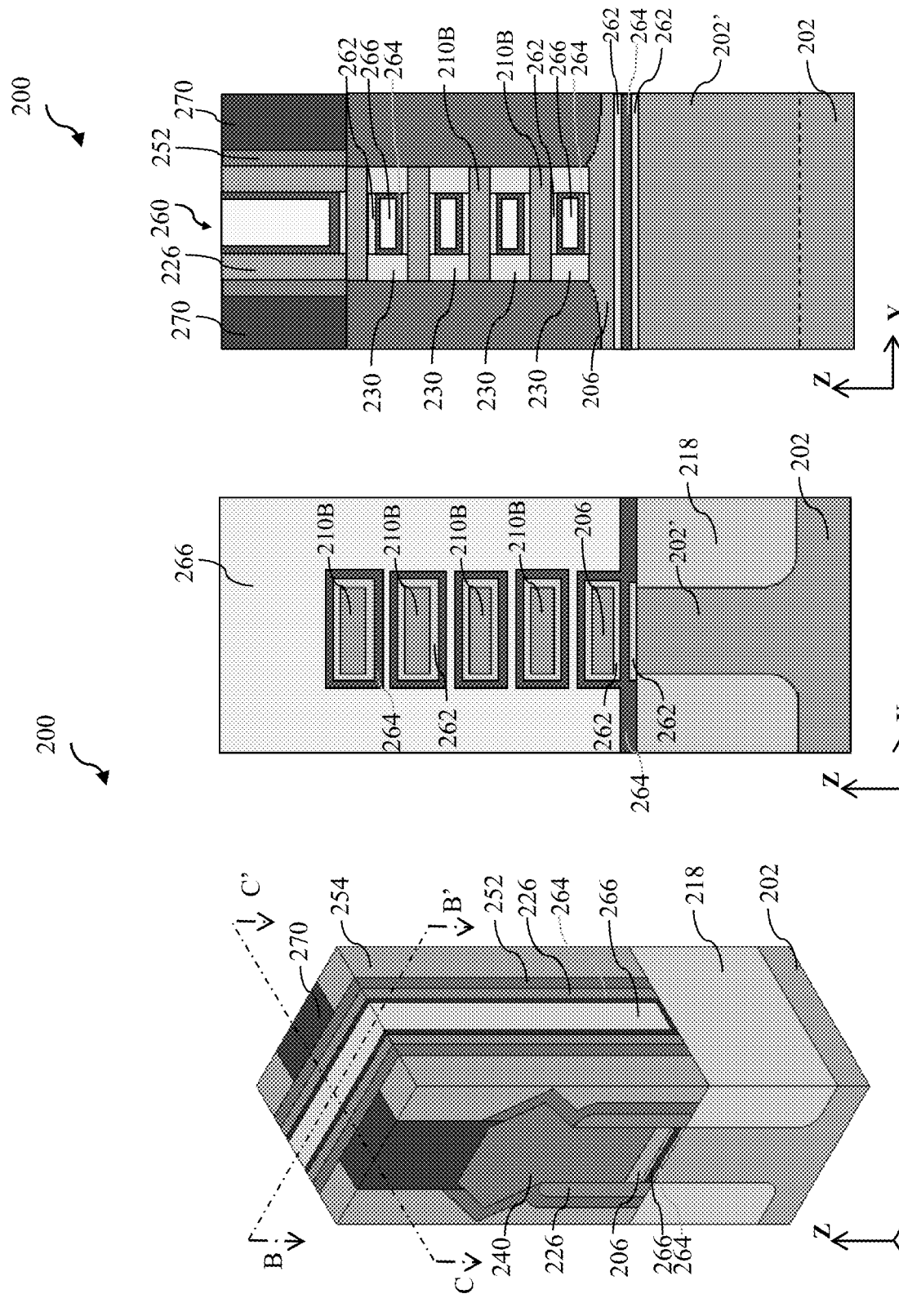

GATE-ALL-AROUND STRUCTURE WITH SELF SUBSTRATE ISOLATION AND METHODS OF FORMING THE SAME

PRIORITY DATA

The present application is a continuation application of U.S. patent application Ser. No. 17/498,093, filed Oct. 11, 2021, which is a divisional application of U.S. patent application Ser. No. 16/583,449, filed Sep. 26, 2019, which is hereby incorporated by reference in its entirety.

BACKGROUND

Multi-gate devices have been introduced to improve gate control by increasing gate-channel coupling and reducing off-state current. One such multi-gate device is a gate-all-around (GAA) device. A GAA device generally refers to any device having a gate structure, or portions thereof, formed on more than one side of a channel region (for example, surrounding a portion of the channel region). GAA transistors are compatible with conventional complementary metal-oxide-semiconductor (CMOS) fabrication processes and allow aggressive scaling down of transistors. However, fabrication of GAA devices presents challenges. For example, in a conventional GAA device, the epitaxial source/drain (S/D) features directly contact the substrate. This may cause junction leakage and latch-up issues between the epitaxial S/D features, and therefore degrade the GAA device's performance. Improvements are thus needed.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A-17A illustrate three-dimensional perspective views of an example semiconductor device at intermediate stages of the method of FIG. 1 in accordance with some embodiments of the present disclosure;

FIGS. 2B-17B illustrate cross-sectional views in a plane B-B' of the semiconductor device at intermediate stages of the method of FIG. 1 in accordance with some embodiments of the present disclosure;

FIGS. 2C-17C illustrate cross-sectional views in a plane C-C' of the semiconductor device at intermediate stages of the method of FIG. 1 in accordance with some embodiments of the present disclosure.

DETAILED DESCRIPTION

Figure 1:
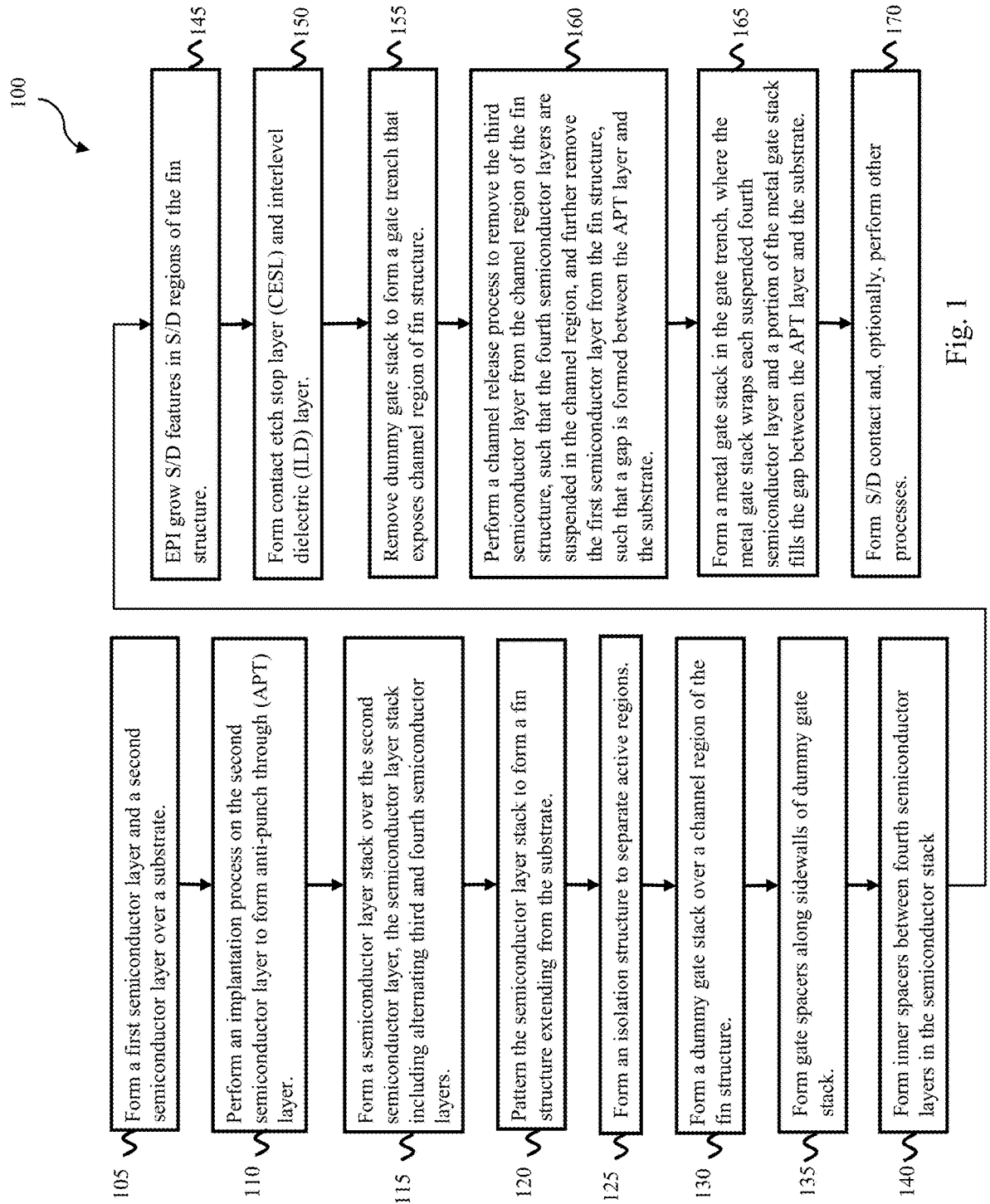
FIG. 1 illustrates a flowchart of an example method for making a semiconductor device in accordance with some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for case of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices and the fabrication thereof, and more particularly to methods of fabricating field-effect transistors (FETs), such as gate-all-around FETs (GAA FETs).

In a GAA device, a channel region of a single device may include multiple layers of semiconductor material physically separated from one another. In some examples, a gate of the device is disposed above, alongside, and even between the semiconductor layers of the device. This configuration may place more semiconductor material proximate to the gate and thereby improve the control of carriers through the channel region. In turn, the GAA device allows more aggressive gate length scaling for both performance and density improvement than a fin-like field-effect-transistor (FinFET) device. The present disclosure is generally related to formation of GAA devices, wherein an anti-punch through (APT) layer is formed between the substrate and the epitaxial S/D features. The APT layer is isolated from the substrate by a substrate isolation layer including dielectric material (in particular, dielectric material that is the same as gate dielectric material of a metal gate of the GAA device). And the APT layer extends without interruption under the epitaxial S/D features and the gate structure. Accordingly, the epitaxial S/D features directly contact the APT layer and are separated from the substrate. A dopant concentration in the APT layer is greater than a dopant concentration of the substrate. Therefore, the GAA device examples in the present disclosure can mitigate the junction leakage and latch-up issues between the epitaxial S/D features and the performance of the GAA device is improved. In addition, the fabrication of the GAA device in the present disclosure is compatible with current GAA processing, so no extra process steps are needed for the isolation. Furthermore, in the present GAA device examples, instead of the high cost silicon on insulator (SOI) substrate, bulk Si substrate is allowed to be used to realize the isolation, thereby the fabrication cost can be reduced. Of course, these advantages are merely exemplary, and no particular advantage is required for any particular embodiment.

Figure 18:
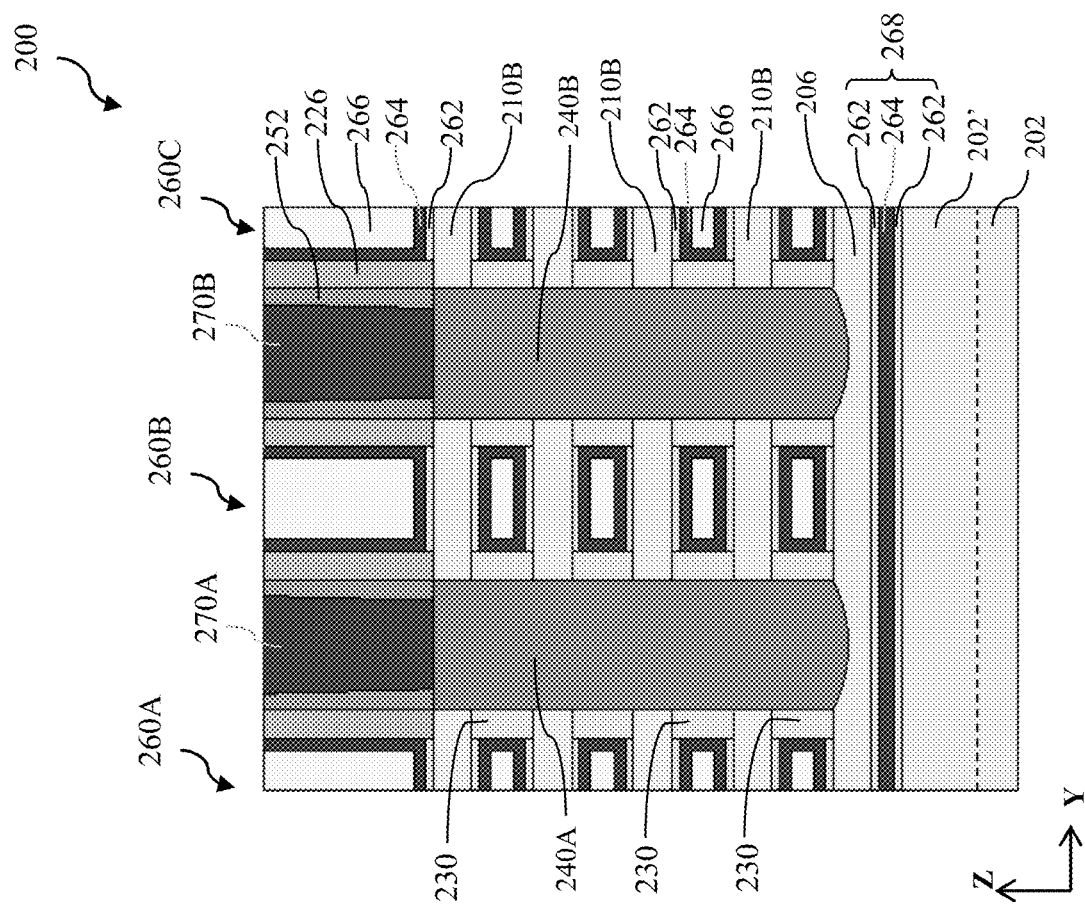
FIG. 18 illustrates a cross-sectional view in the plane C-C' of the semiconductor device including multiple gate structures in accordance with some embodiments of the present disclosure.

FIG. 1 illustrates a flow chart of a method 100 for forming a semiconductor device 200 (hereafter called device 200) in accordance with some embodiments of the present disclosure. Method 100 is merely an example and is not intended to limit the present disclosure beyond what is explicitly recited in the claims. Additional operations can be performed before, during, and after method 100, and some operations described can be replaced, eliminated, or moved around for additional embodiments of the method. Method 100 is described below in conjunction with other figures, which illustrate various three-dimensional and cross-sectional views of device 200 during intermediate steps of method 100. In particular, FIGS. 2A-17A illustrate three-dimensional views of device 200; FIGS. 2B-13B illustrate cross-sectional views of device 200 taken along the plane B-B' shown in FIGS. 2A-17A (that is, in a X-Z plane); and FIGS. 2C-17C illustrate cross-sectional views of device 200 taken along the plane C-C' shown in FIGS. 2A-17A (that is, in an Y-Z plane). FIG. 18 illustrates a cross-sectional view of device 200 showing multiple gate structures taken along the plane C-C' shown in FIGS. 2A-17A (that is, in the Y-Z plane).

Device 200 may be an intermediate device fabricated during processing of an integrated circuit (IC), or a portion thereof, that may comprise static random-access memory (SRAM) and/or other logic circuits, passive components such as resistors, capacitors, and inductors, and active components such as p-type FETs (PFETs), n-type FETs (NFETs), fin-like FETs (FinFETs), metal-oxide semiconductor field effect transistors (MOSFET), complementary metal-oxide semiconductor (CMOS) transistors, bipolar transistors, high voltage transistors, high frequency transistors, and/or other memory cells. Device 200 can be a portion of a core region (often referred to as a logic region), a memory region (such as a static random access memory (SRAM) region), an analog region, a peripheral region (often referred to as an input/output (I/O) region), a dummy region, other suitable region, or combinations thereof, of an IC. In some embodiments, device 200 may be a portion of an IC chip, a system on chip (SoC), or portion thereof. The present disclosure is not limited to any particular number of devices or device regions, or to any particular device configurations.

Referring to FIGS. 1 and 2A-2C, at operation 105, a substrate (wafer) 202 is received. In the depicted embodiment, the substrate 202 is a bulk substrate that includes silicon. Alternatively or additionally, the bulk substrate includes another elementary semiconductor, such as germanium; a compound semiconductor, such as silicon carbide, silicon phosphide, gallium arsenide, gallium phosphide, indium phosphide, indium arsenide, indium antimonide, zinc oxide, zinc selenide, zinc sulfide, zinc telluride, cadmium selenide, cadmium sulfide, and/or cadmium telluride; an alloy semiconductor, such as SiGe, SiPC, GaAsP, AlInAs, AlGaAs, GaInAs, GaInP, and/or GaInAsP; other group III-V materials; other group II-IV materials; or combinations thereof. In some embodiments, the substrate 202 is doped with a p-type or n-type dopant of a dopant concentration about $1\times10^{15}$ atoms/$cm^{-3}$ to about $1\times10^{19}$ atoms/$cm^{-3}$.

The substrate 202 may include various doped regions. In some embodiments, the substrate 202 includes n-type doped regions (for example, n-type wells) doped with n-type dopants, such as phosphorus (for example, $^{31}P$), arsenic, other n-type dopant, or combinations thereof. In some embodiments, the substrate 202 includes p-type doped region (for example, p-type wells) doped with p-type dopants, such as boron (for example, $^{11}B$, $BF_2$), indium, other p-type dopant, or combinations thereof. In some embodiments, the substrate 202 includes doped regions formed with a combination of p-type dopants and n-type dopants. The various doped regions can be formed directly on and/or in the substrate 202, for example, providing a p-well structure, an n-well structure, a dual-well structure, a raised structure, or combinations thereof. An ion implantation process, a diffusion process, and/or other suitable doping process can be performed to form the various doped regions.

Still at operation 105, a first semiconductor layer 204 is formed over the substrate 202. The first semiconductor layer 204 includes a different semiconductor material than the substrate 202, such that the first semiconductor layer 204 and the substrate 202 can provide different etching selectivities in the following processes. In the depicted embodiment, the first semiconductor layer 204 include silicon germanium (SiGe) while the substrate 202 includes silicon (Si). The first semiconductor layer 204 has a height H1 in a direction that is generally perpendicular to a top surface of the substrate 202 (i.e., in the Z-direction). In some embodiments, the height H1 is about 2 nanometers (nm) to about 10 nm. The first semiconductor layer 204 is formed by any suitable process, for example, a molecular beam epitaxy (MBE) process, a chemical vapor deposition (CVD) process, such as a metal organic CVD (MOCVD) process, and/or other suitable epitaxial growth processes.

Still at operation 105, a second semiconductor layer 206 is formed over the first semiconductor layer 204. In some embodiments, the second semiconductor layer 206 includes a different semiconductor material than the first semiconductor layer 204 and a same semiconductor material as the substrate 202, such that the second semiconductor layer 206 and the first semiconductor layer 204 can provide different etching selectivities in the following processes. In the depicted embodiment, the second semiconductor layer 206 includes Si (like the substrate 202), while the first semiconductor layer 204 includes SiGe. Note that although the second semiconductor layer 206 and the substrate 202 include the same semiconductor material (for example, Si), the second semiconductor layer 206 and the substrate 202 may have different dopant concentrations, as discussed below. The second semiconductor layer 206 has a height H2 in the Z-direction. In some embodiments, the height H2 is about 2 nm to 15 nm. The second semiconductor layer 206 is formed by any suitable process similar as the formation of the first semiconductor layer 204. For example, second semiconductor layer 206 is grown by a MBE process, a CVD process, such as a MOCVD process, and/or other suitable epitaxial growth processes.

Still referring to FIGS. 1 and 2A-2C, at operation 110, an implantation process 300 is performed to implant an n-type dopant (such as phosphorus, arsenic, other n-type dopant, or combinations thereof) or a p-type dopant (such as boron, gallium, other p-type dopant, or combinations thereof) in the second semiconductor layer 206. Thereafter, an annealing process is applied to the second semiconductor layer 206 (in some embodiments, at a temperature of about 900° C. to about 1100° C.) to activate the dopant in the second semiconductor layer 206. A dopant concentration of the n-type dopant or the p-type dopant in the second semiconductor layer 206 is greater than the dopant concentration of the n-type dopant or the p-type dopant in the substrate 202. For example, a dopant concentration of the second semiconductor layer 206 is about $1 \times 10^{17}$ atoms/cm$^{-3}$ to about $1 \times 10^{20}$ atoms/cm$^{-3}$. The doped second semiconductor layer 206 with a greater dopant concentration than the substrate 202 is referred to as an anti-punch through (APT) layer.

Now referring to FIGS. 1 and 3A-3C, at operation 115, a semiconductor layer stack 210 (hereafter called stack 210) is formed over the APT layer 206. In the depicted embodiment, the stack 210 includes alternating semiconductor layers, such as third semiconductor layers 210A composed of a first semiconductor material and fourth semiconductor layers 210B composed of a second semiconductor material that is different from the first semiconductor material. The different semiconductor materials composed in alternating semiconductor layers 210A and 210B are provided for different oxidation rates and/or different etch selectivity. In some embodiments, the first semiconductor material of the third semiconductor layers 210A is the same as the first semiconductor layer 204, and the second semiconductor material of the fourth semiconductor layers 210B is the same as the APT layer 206 and the substrate 202 (but with different dopant concentrations), such that the third semiconductor layers 210A and the first semiconductor layer 204 can be selectively removed simultaneously, while the fourth semiconductor layers 210B and the APT layer 206 are substantially unchanged. For example, the third semiconductor layers 210A comprise Si (like the APT layer 206 and the substrate 202), and the fourth semiconductor layers 210B comprise SiGe (like the first semiconductor layer 204). Thus, the stack 210 is arranged with alternating SiGe/Si/SiGe/Si/ . . . layers from bottom to top. In some embodiments, the material of the top semiconductor layer may be or may not be the same as the bottom semiconductor layer in the stack. For example, for a stack that includes alternating SiGe and Si layers, the bottom semiconductor layer comprises SiGe, and the top semiconductor layer may be a semiconductor layer that comprises Si or SiGe. In the depicted embodiment, the bottom semiconductor layer 210A comprises SiGe, while the top semiconductor layer 210B comprises Si.

In some embodiments, the fourth semiconductor layers 210B may be undoped or substantially dopant-free (i.e., having an extrinsic dopant concentration from about 0 atoms/cm$^{-3}$ to about $1 \times 10^{17}$ atoms/cm$^{-3}$). In some embodiments, no intentional doping is performed when forming the fourth semiconductor layers 210B. In some other embodiments, the semiconductor layers 210B may be doped with a p-type dopant, such as boron (B, $^{11}$B or BF$_2$), gallium (Ga), or combinations thereof, or an n-type dopant, such as phosphorus (P, $^{31}$P), arsenic (As), or combinations thereof. For example, the semiconductor layers 210B may be intentionally doped for an extrinsic dopant concentration from about $1 \times 10^{15}$ atoms/cm$^{-3}$ to about $5 \times 10^{17}$ atoms/cm$^{-3}$. In some embodiments, the dopant concentration of the semiconductor layers 210B is less than the dopant concentration of the substrate 202 (about $1 \times 10^{15}$ atoms/cm$^{-3}$ to about $1 \times 10^{19}$ atoms/cm$^{-3}$) which is further less than the dopant concentration of the APT layer 206 (about $1 \times 10^{17}$ atoms/cm$^{-3}$ to about $1 \times 10^{20}$ atoms/cm$^{-3}$). A number of the semiconductor layers 210B in the stack 210 depends on design of the device 200. For example, the stack 210 may comprise one to ten semiconductor layers 210B. In some embodiments, different semiconductor layers 210A and 210B in the stack 210 have the same thickness in the Z-direction. In some other embodiments, different semiconductor layers 210A and 210B in the stack 210 have different thicknesses. Each of semiconductor layers 210A has a thickness H3 in the Z-direction, and each of semiconductor layers 210B has a thickness H4 in the Z-direction. The height H3 and the height H4 is about 4 nm to about 15 nm. In the depicted embodiment, the height H3 of the third semiconductor layers 210A is greater than the height H1 of the first semiconductor layer 204, such that in a later metal gate formation process, the first semiconductor layer 204 is replaced with only the gate dielectric of a metal gate stack, while the third semiconductor layers 210A are replaced with the gate dielectric and the gate electrode of the metal gate stack. In some embodiments, the height H1 is equal to a desired thickness of a gate dielectric of a metal gate stack, while the height H3 is equal to a desired thickness of a gate dielectric and a gate electrode of the metal gate stack.

The stack 210 is formed over the APT layer 206 using any suitable process. In some embodiments, the semiconductor layers 210A and/or 210B are formed by suitable epitaxy process, for example, a MBE process, a CVD process, such as a MOCVD process, and/or other suitable epitaxial growth processes.

Figure 4C:
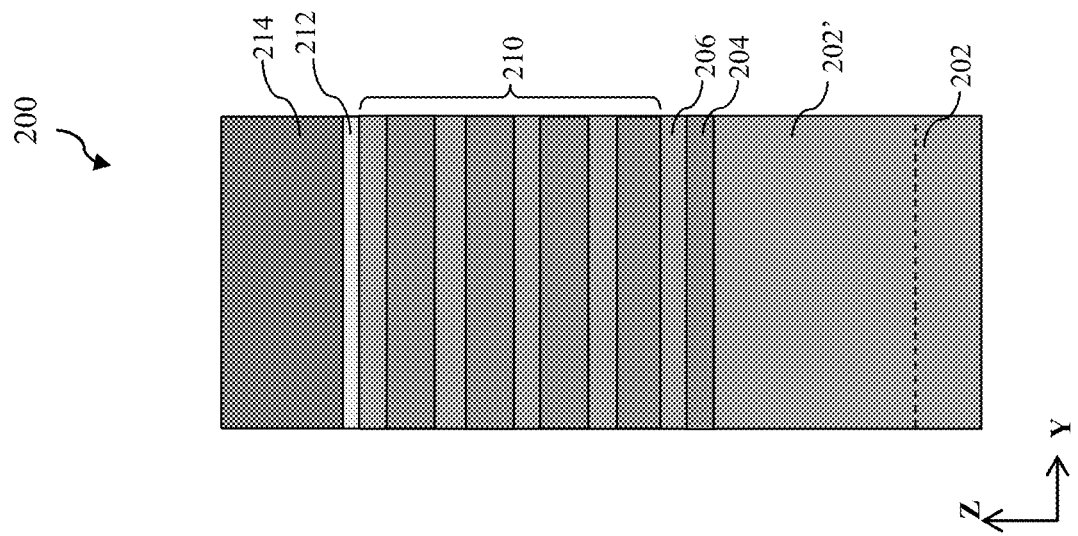
Figure 4B:
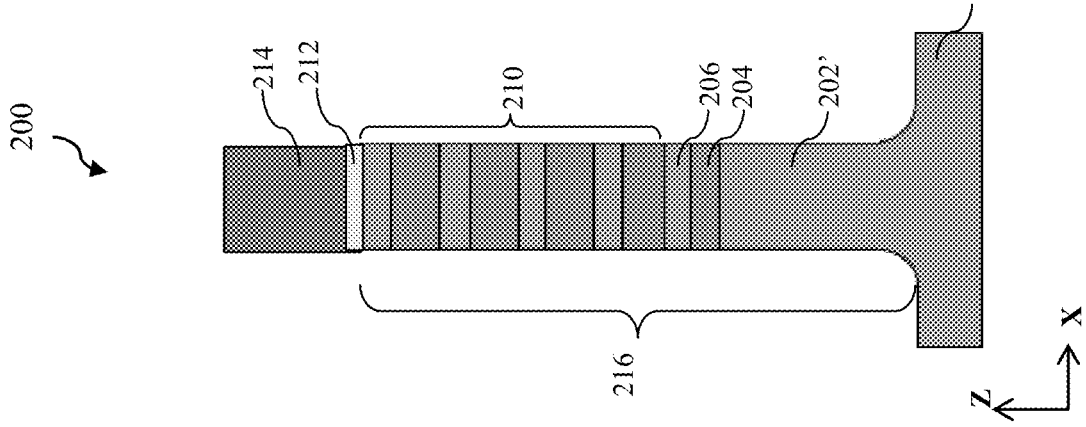
Figure 4A:
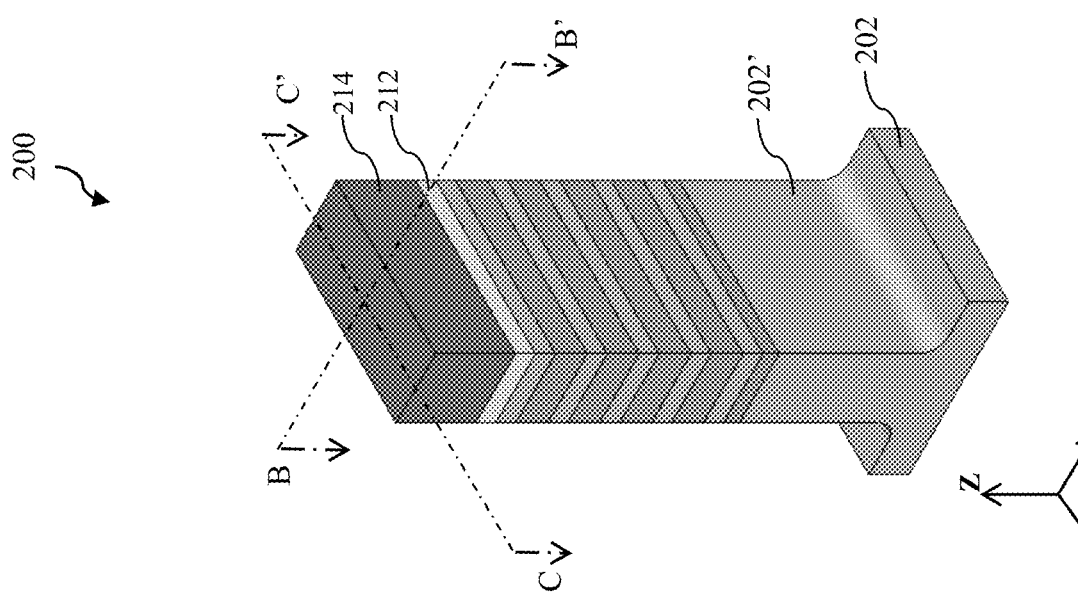

Now referring to FIGS. 1 and 4A-4C, at operation 120, a top portion of the substrate 202, the first semiconductor layer 204, the APT layer 206, and the stack 210 (including the semiconductor layers 210A and 210B) are patterned to form a fin structure 216 extending from the substrate 202. Operation 120 includes several steps. For example, a hard mask layer 212 is deposited over the stack 210. The hard mask layer 212 includes any suitable material, for example, silicon oxide (SiO), silicon oxy carbide (SiOC), silicon carbide (SiC), silicon carbonitride (SiCN), silicon nitride (SiN), silicon oxy carbonitride (SiOCN), other suitable material, or combinations thereof. The hard mask layer 212 is formed by any suitable process, for example, a deposition process including CVD, physical vapor deposition (PVD), atomic layer deposition (ALD), spin on, other suitable methods, or combinations thereof. Thereafter, a photoresist layer 214 is formed over the hard mask layer 212. The photoresist layer 214 is patterned such that a portion of the hard mask layer 212 over the stack 210 is exposed by openings in the photoresist layer 214. In a next step, the hard mask layer 212 is etched through the photoresist layer 214 to form a patterned hard mask layer. The patterned hard mask layer is then used as a mask to etch the top portion of the substrate 202, the first semiconductor layer 204, the APT layer 206, and the stack 210 to form the fin structure 216. As depicted in FIGS. 4A-4C, the fin structure 216 includes the patterned top portion of the substrate (i.e., a fin substrate 202'), the patterned first semiconductor layer 204, the patterned APT layer 206, and the patterned stack 210 including the alternating semiconductor layers 210A and 210B. The fin structure 216 defines the active regions of device 200. The etching processes may include one or more dry etching processes, wet etching processes, and/or other suitable etching techniques. For example, a dry etching process may implement an oxygen-containing gas, a fluorine-containing gas (e.g., CF4, SF6, CH2F2, CHF3, and/or C2F6), a chlorine-containing gas (e.g., Cl2, CHCl3, CCl4, and/or BCl3), a bromine-containing gas (e.g., HBr and/or CHBR3), an iodine-containing gas, other suitable gases and/or plasmas, and/or combinations thereof. For example, a wet etching process may comprise etching in diluted hydrofluoric acid (DHF); potassium hydroxide (KOH) solution; ammonia (NH3); a solution containing hydrofluoric acid (HF), nitric acid (HNO3), and/or acetic acid (CH3COOH); or other suitable wet etchant(s). Still at operation 120, the hard mask layer 212 is then removed by any suitable process, for example, an etching process or CMP. The photoresist layer 214 may be removed before or after the fin structure 216 is formed by any suitable process.

Now referring to FIGS. 1 and 5A-5C, at operation 125, an isolation structure 218 is formed to separate and isolate the active regions of device 200. In some embodiments, a dielectric material, such as silicon oxide (SiO) and/or silicon nitride (SiN), is deposited over the substrate 202 along sidewalls of the fin structure 216. The dielectric material may be deposited by CVD, plasma enhanced CVD (PECVD), PVD, thermal oxidation, or other techniques. Subsequently, the dielectric material is recessed (for example, by etching) to form the isolation structure 218. In some embodiments, a top surface of the isolation structure 218 is substantially planar with a bottom surface of the first semiconductor layer 204, as depicted in FIGS. 5A-5C. In some embodiments, the top surface of the isolation structure 218 is lower than the bottom surface of the first semiconductor layer 204 (and, thus, is lower than top surface of the fin substrate 202'). In some embodiments, the top surface of the isolation structure 218 is higher than the bottom surface of the first semiconductor layer 204, yet is lower than a bottom surface of the stack 210 (i.e., lower than a bottom surface of the bottommost semiconductor layer 210A).

Figure 6C:
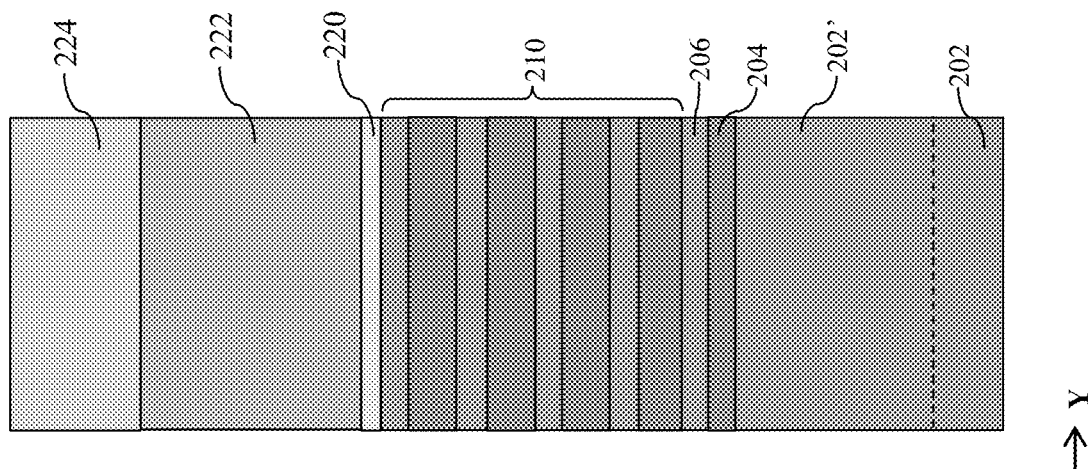
Figure 6B:
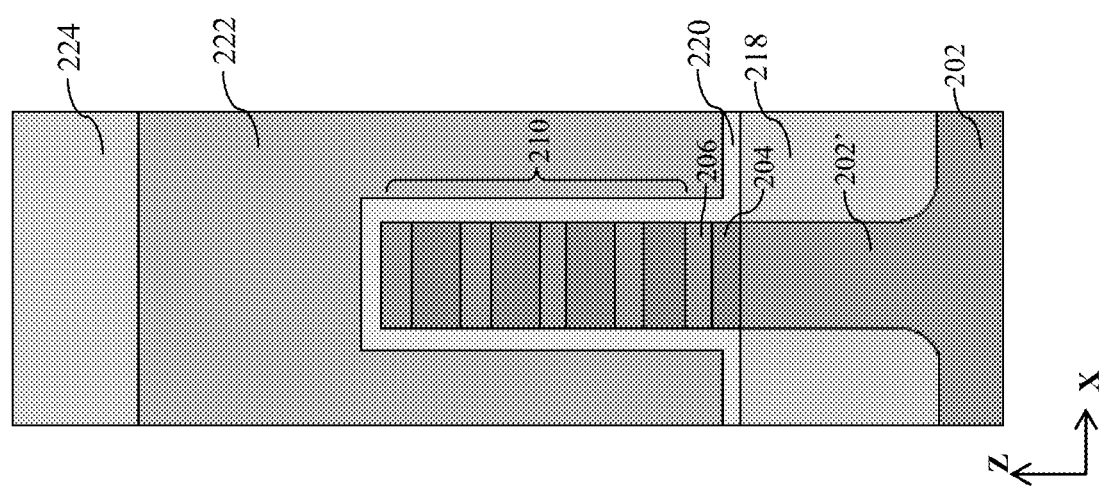
Figure 6A:
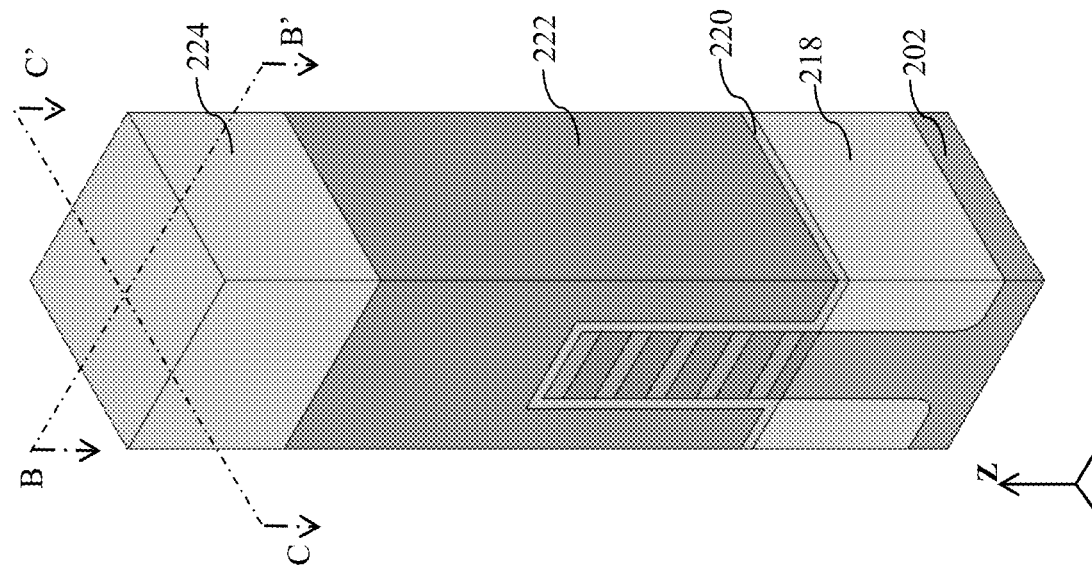

Now referring to FIGS. 1, 6A-6C, and 7A-7C, at operation 130, a dummy gate stack 225 is formed over the fin structure 216 and the isolation structure 218. In FIGS. 6A-6C, dummy gate layers are deposited over the fin structure 216 and the isolation structure 218, such as an interfacial layer 218, a dummy gate electrode 222, and a hard mask layer 224. In the depicted embodiment, the interfacial layer 220 is disposed over the fin structure 216 and the isolation structure 218 and may include any suitable material, for example, silicon oxide (such as, silicon dioxide (SiO$_2$), silicon oxy nitride (SiON), hafnium silicon oxide (HfSiO), or other silicon oxide material). The dummy gate electrode 222 is disposed over the interfacial layer 220 and comprises polysilicon (poly). The dummy gate electrode 222 can be a single dielectric layer or multiple layers. The hard mask layer 224 is disposed over the dummy gate electrode 222 and may include any suitable material, for example SiO, SiN, or combinations thereof. A deposition process may be performed to form the interfacial layer 220, the dummy gate electrode layer 222, and the hard mask layer 224 over the substrate. The deposition process includes CVD, PVD, ALD, plating, other suitable methods, or combinations thereof.

Figure 7C:
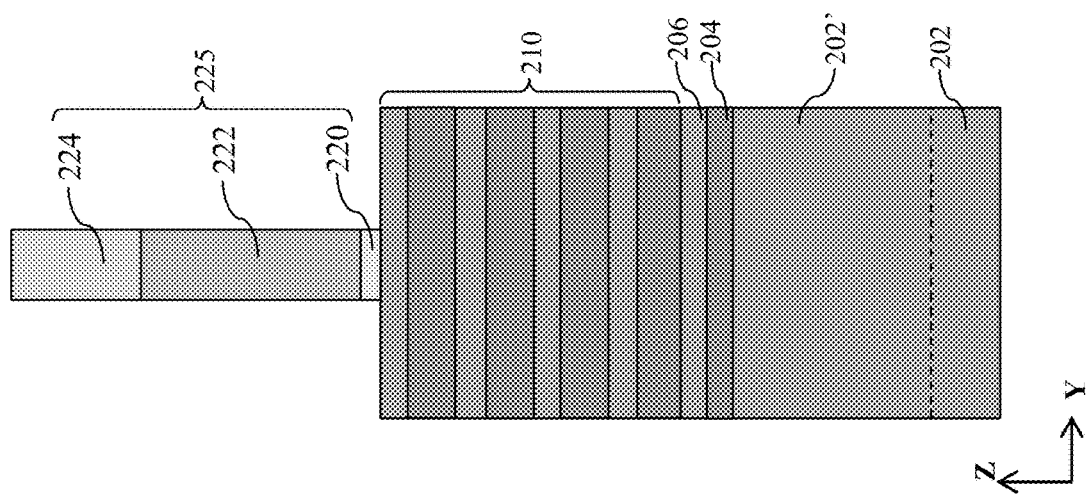
Figure 7B:
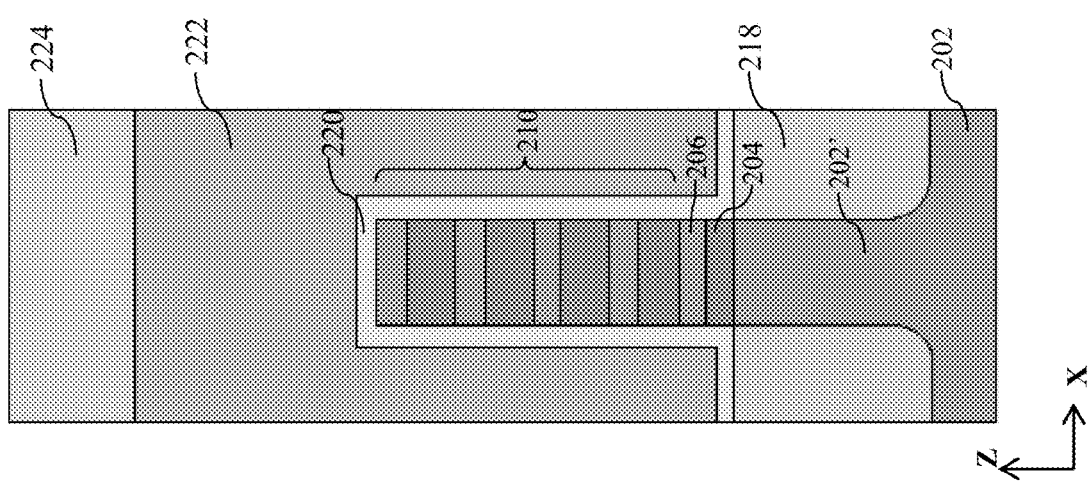
Figure 7A:
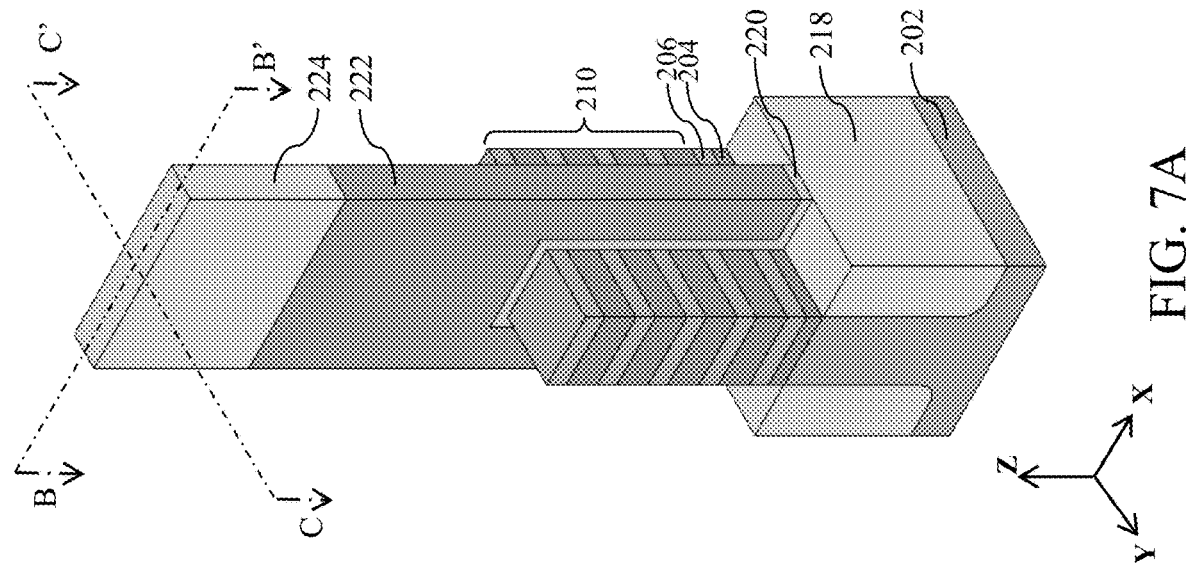

In FIGS. 7A-7C, the dummy gate layers are patterned to form a dummy gate stack 225 that includes the interfacial layer 218, the dummy gate electrode 222, and the hard mask layer 224. A lithography patterning and etching process is performed to pattern the interfacial layer 220, the dummy gate electrode layer 222, and the hard mask layer 224 to form the dummy gate stack 225 over the channel region of the fin structure 216. The lithography patterning processes include resist coating (for example, spin-on coating), soft baking, mask aligning, exposure, post-exposure baking, developing the resist, rinsing, drying (for example, hard baking), other suitable processes, or combinations thereof. The etching processes include dry etching, wet etching, other etching methods, or combinations thereof. In the depicted embodiment, the dummy gate stack 225 is disposed over a channel region of the fin structure 216, thereby interposing respective S/D regions of the fin structure 216. The dummy gate stack 225 serves as a placeholder for subsequently forming a metal gate stack. The dummy gate stack 225 extends along the X-direction and may traverse more than one fin structure 216 (not shown).

Figure 8C:
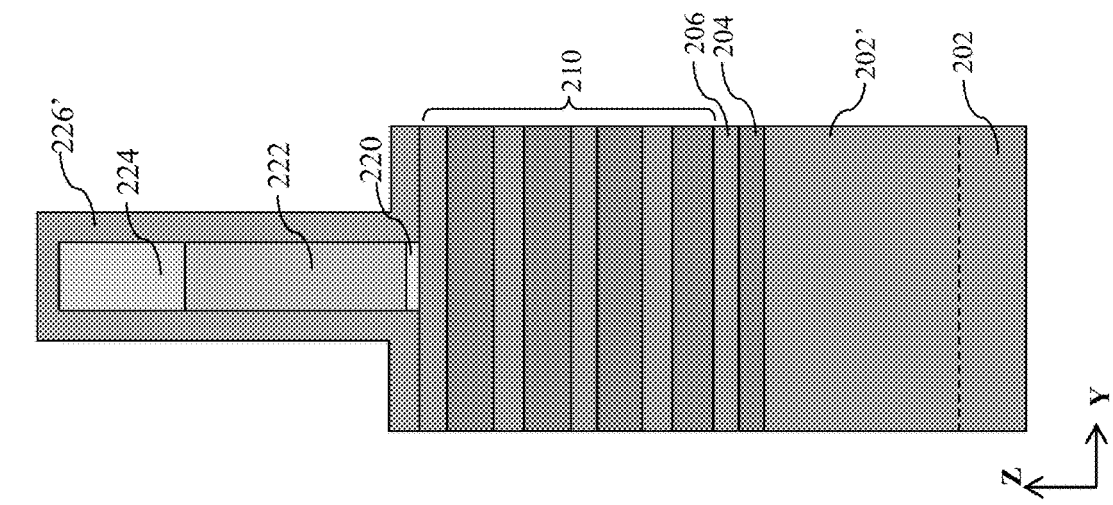
Figure 8B:
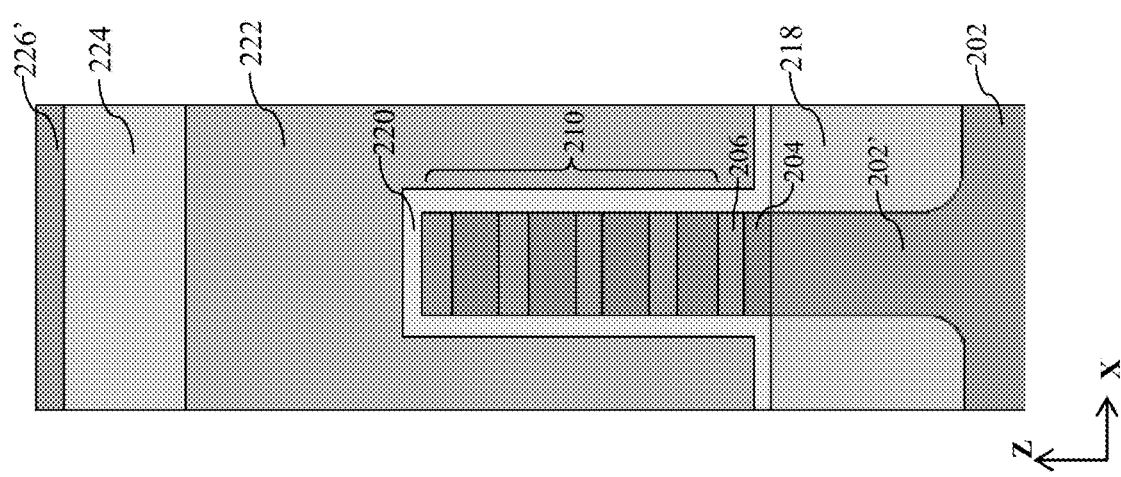
Figure 8A:
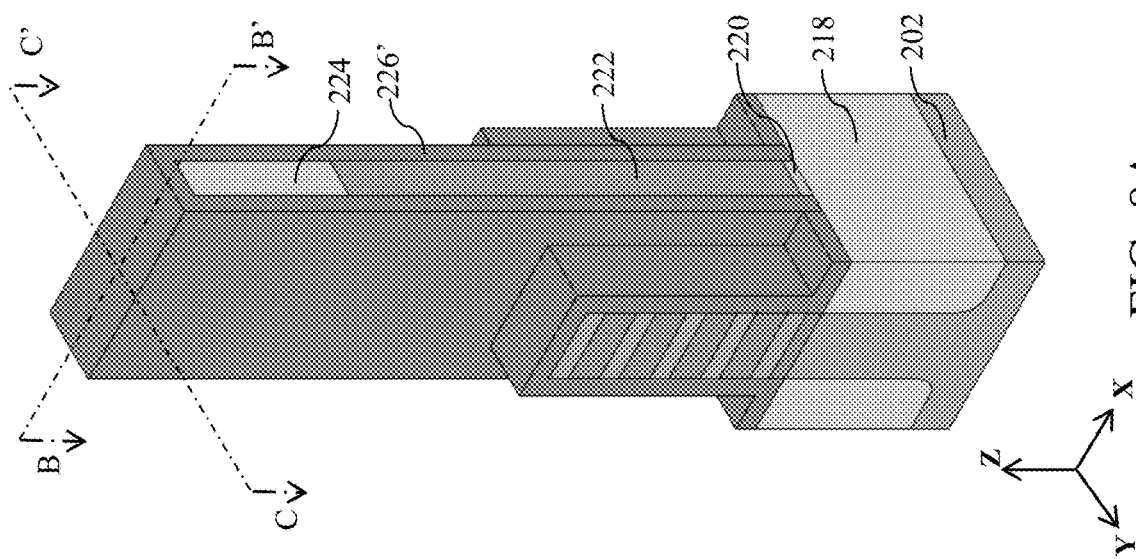

Now referring to FIGS. 1, 8A-8C, and 9A-9C, at operation 135, gate spacers 226 are formed along sidewalls of the dummy gate stack 225. For example, as depicted in FIGS. 8A-8C, a spacer layer 226' is formed conformally over the isolation structure 218, the fin structure 216, and the dummy gate stack 225. In some embodiments, the spacer layer 226' may include silicon, oxygen, carbon, nitrogen, other suitable material, or combinations thereof (for example, SiO, SiN, SION, SiCN, SiOC, SiOCN, etc.). In some examples, the spacer layer 226' includes a multi-layer structure, such as a first dielectric layer that includes SiN and a second dielectric layer that includes SiO. In some embodiments, a thickness of the spacer layer 226' is about 1 nm to about 10 nm. The spacer layer 226' may be formed by any suitable method, such as ALD, CVD, PVD, other suitable methods, or combinations thereof. In the depicted embodiment, the spacer layer 226' is formed by a thermal ALD process. Thereafter, as depicted in FIGS. 9A-9C, an etching process is performed to remove portions of the spacer layer 226', such that remaining portions of the spacer layer 226' form the gate spacers 226. In some embodiments, the etching process is an anisotropic etching process, such that only portions of the spacer layer 226' in the X-Y plane are removed. Portions of the spacer layer 226' along the Z-direction remains substantially unchanged and form the gate spacers 226. In some embodiments, a thickness of the gate spacer 226 in the X-direction is about 1 nm to about 10 nm.

Still at operation 130, another etching process (referred to as S/D etching) is performed to portions of the stack 210 in the S/D regions of the fin structure 216 along the gate spacers 226 to form S/D trenches 228. The S/D etching process may be a dry etching, a wet etching, or combinations thereof. A time control is performed to the S/D etching process, such that the etching process stops at the APT layer 206. In some embodiments, the APT layer 206 remains unchanged during the S/D etching process. In some embodiments, the top surface of the APT layer 206 may be slightly removed during the S/D etching process. As depicted in FIGS. 9A and 9C, the S/D trenches 228 include a sidewall formed by the sidewalls of the stack 210 (including alternating semiconductor layers 210A and 210B) and a bottom surface formed by a top surface of the APT layer 206. The sidewalls of the alternating semiconductor layers 210A and 210B are thus exposed in by S/D trenches 228.

Now referring to FIGS. 1, 10A-10C, and 11A-11C, at operation 140, inner spacers 230 are formed between the semiconductor layers 210B and between the bottom semiconductor layer 210B and the APT layer 206. Referring to FIGS. 10A-10C, portions of the semiconductor layers 210A exposed in the S/D trenches 228 are selectively removed by a suitable etching process to form gaps 229 between the semiconductor layers 210B and between the bottom semiconductor layer 210B and the APT layer 206, such that portions (edges) of the semiconductor layers 210B are suspended. An extent of which the semiconductor layers 210B are removed may be controlled by duration of the etching process. In some embodiments, an extent of the selective removing of the semiconductor layers 210A is about 2 nm to about 15 nm. As discussed above, in the depicted embodiment, the semiconductor layers 210A include SiGe, the semiconductor layers 210B include Si, and the APT layer 206 include Si. Accordingly, the etching process at operation 135 selectively removes potions of the semiconductor layers 210A without removing or substantially removing the semiconductor layers 210B and the APT layer 206. In some embodiments, the etching process is a selective isotropic etching process (e.g., a selective dry etching process or a selective wet etching process). In some embodiments, the selective wet etching process may include a hydro fluoride (HF), fluoride (F2) or ammonium hydroxide (NH4OH) etchant. In some embodiments, the selective removal of the semiconductor layers 210A may include a SiGe oxidation process followed by a SiGeOx removal process. For example, the SiGe oxidation process may include forming and patterning various masking layers such that the oxidation is controlled to the SiGe layers. In other embodiments, the SiGe oxidation process is a selective oxidation due to the different compositions of the semiconductor layers 210A, 210B and the APT layer 206. In some embodiments, the SiGe oxidation process may be performed by exposing the device 200 to a wet oxidation process, a dry oxidation process, or a combination thereof. Thereafter, the oxidized semiconductor layers, which include SiGeOx, are removed by an etchant, such as NH4OH or diluted HF.

Next, referring to FIGS. 11A-11C, inner spacers 230 are formed in the gaps 229 between the semiconductor layers 210B and the bottom semiconductor layer 210B and the APT layer 206. A material of the inner spacers 230 may be similar to that of the gate spacers 226. For example, the inner spacers 230 includes SiO, SiON, SiN, SiCN, SiOC, SiOCN, or combinations thereof. In some embodiments, the inner spacer material is deposited in the S/D trenches 228 as well as the gaps 229 by any suitable deposition process, for example CVD, PVD, ALD, or combinations thereof. Then, the inner spacer material is removed along sidewalls of the gate spacers 226 until the sidewalls of the semiconductor layers 210B are exposed in the S/D trenches 228. The remaining inner spacer material forms the inner spacers 230. In some embodiments, the width of the inner spacers 230 in the X-direction is about 2 nm to about 15 nm which is the selective etching extent of the semiconductor layers 210A. Therefore, as depicted in FIGS. 11A and 11C, the sidewalls of S/D trenches 228 are further formed by sidewalls of the inner spacers 230.

Now referring to FIGS. 1 and 12A-12C, at operation 145, epitaxial S/D features 240 are grown in the S/D trenches 228 (the S/D regions) of device 200. In various embodiments, the epitaxial S/D features 240 may include a semiconductor material such as silicon (Si) or germanium (Ge); a compound semiconductor such as silicon germanium (SiGe), silicon carbide (SiC), gallium arsenide (GaAs), gallium phosphide (GaP), indium phosphide (InP), indium arsenide (InAs), indium antimonide (InSb); an alloy semiconductor such GaAsP, AlInAs, AlGaAs, InGaAs, GaInP, and/or GaInAsP; or combinations thereof. In the depicted embodiments, a top surface of the epitaxial S/D features 240 is substantially planar with a top surface of the stack 210 (i.e., a topmost semiconductor layer 210B). In some embodiments, the top surface of the epitaxial source/drain features is higher than the top surface of stack 210.

An epitaxy process may be implement to epitaxially grow S/D features 240. The epitaxy process may include CVD deposition (for example, vapor-phase epitaxy (VPE), ultra-high vacuum CVD (UHV-CVD), low-pressure CVD (LPCVD), and/or plasma-enhanced (PECVD)), molecular beam epitaxy, other suitable SEG processes, or combinations thereof. The epitaxy process can use gaseous and/or liquid precursors. Epitaxial S/D features 240 may be doped with n-type dopants and/or p-type dopants. In some embodiments, epitaxial S/D features 240 are doped with boron, boron difluoride, carbon, other p-type dopant, or combinations thereof (for example, forming an Si:Ge:B epitaxial S/D feature or an Si:Ge:C epitaxial S/D feature). In some embodiments, epitaxial S/D features 240 are doped with phosphorous, arsenic, other n-type dopant, or combinations thereof (for example, forming an Si:P epitaxial S/D feature, an Si:C epitaxial S/D feature, or an Si:C:P epitaxial S/D feature). In some embodiments, epitaxial S/D features 240 may include multiple epitaxial semiconductor layers, and different epitaxial semiconductor layers are different in amount of dopant included therein. In some embodiments, epitaxial S/D features 240 include materials and/or dopants that achieve desired tensile stress and/or compressive stress in the channel regions. In some embodiments, epitaxial S/D features 240 are doped during deposition by adding impurities to a source material of the epitaxy process. In some embodiments, epitaxial S/D features 240 are doped by an ion implantation process subsequent to a deposition process. In some embodiments, annealing processes are performed to activate dopants in epitaxial S/D features 240, such as HDD regions and/or LDD regions. In FIGS. 12A and 12C, a bottom surface of the epitaxial S/D features 240 directly contacts a top surface of the APT layer 206, which is separated from the fin substrate 202'. Therefore, the epitaxial S/D features 240 does not directly contact the fin substrate 202' (i.e., the substrate 202), which can mitigate junction leakage between the epitaxial S/D features 240.

Now referring to FIGS. 1 and 13A-13C, at operation 150, a contact etch stop layer (CESL) 252 and an interlayer dielectric (ILD) layer 254 are formed over the device 200. The CESL 252 may include any suitable dielectric material, such as SiO, SiON, SiN, SiCN, SiOC, SiOCN, and may be formed by any suitable method, such as ALD, CVD, PVD, other suitable methods, or combinations thereof. As illustrated in FIGS. 13A and 13C, the CESL 252 is disposed along the gate spacers 226 and covers the epitaxial S/D features 240. In some embodiments, the CESL 252 has a conformal profile over the epitaxial S/D features 240 (e.g., having about the same thickness on top and sidewall surfaces of epitaxial S/D features 240). In some embodiments, the CESL 252 has a thickness of about 1 nm to 10 nm. The ILD layer 254 is formed over the CESL 252. The ILD layer 254 includes a low-k dielectric material, such as tetraethylorthosilicate (TEOS), un-doped silicate glass, or doped silicon oxide (SiO) such as borophosphosilicate glass (BPSG), fused silica glass (FSG), phosphosilicate glass (PSG), boron doped silicon glass (BSG), other suitable dielectric materials, or combinations thereof. The ILD layer 254 may include a multi-layer structure having multiple dielectric materials and may be formed by a deposition process such as CVD, flowable CVD (FCVD), spin-on-glass (SOG), other suitable methods, or combinations thereof. In some embodiments, operation 150 further includes performing a CMP process to planarize a top surface of the device 200. The CMP process also removes the hard mask layer 224 of the dummy gate stack 225. As a result, dummy gate electrode 222 (poly layer) is exposed.

Now referring to FIGS. 1 and 14A-14C, at operation 155, the dummy gate stack 225 (including the dummy gate electrode 222 and the interfacial layer 220) is removed to form a gate trench 256 that exposes the channel region of the fin structure 216, such that the first semiconductor layer 204, the APT layer 206, and alternating semiconductor layers 210A and 210B of the stack 210 are exposed in the gate trench 256. In some embodiments, removing the dummy gate stack 225 (including the dummy gate electrode 222 and the interfacial layer 220) includes one or more etching processes, such as wet etching, dry etching, reactive-ion etching (RIE), or other etching techniques. In some embodiments, if the top surface of the isolation structure 218 is higher than the top surface of the first semiconductor layer 204 and the APT layer 206, an extra etching process is performed to the isolation structure 218 until the top surface of the isolation structure 218 is substantially planar with or lower than the bottom surface of the first semiconductor layer 204.

Now referring to FIGS. 1 and 15A-15C, at operation 160, a channel release process is performed, such that the semiconductor layers 210A and the first semiconductor layer 204 are removed from the gate trench 256. Since the semiconductor layers 210A and the first semiconductor layer 204 include the same material (for example, SiGe), they can be selectively removed simultaneously. As a result, the semiconductor layers 210B are suspended in the channel region of the fin structure 216, the APT layer 206 is suspended above the fin substrate 202', and a gap 258 is formed between the APT layer 206 and the fin substrate 202'. The suspended semiconductor layers 210B are collectively referred to as a nanostructure. In some embodiments, the semiconductor layers 210B are slightly etched or not etched depending on the design of the device 200. For example, semiconductor layers 210B may be slightly etched to form a wire-like shape (for nanowire GAA transistors); semiconductor layers 210B may be slightly etched to form a sheet-like shape (for nanosheet GAA transistors); or, semiconductor layers 210B may be slightly etched to form other geometrical shape (for other nanostructure GAA transistors). In some embodiments, each semiconductor layer 210B and the APT layer 206 have a width W in the X-direction, such as about 5 nm to about 50 nm.

At operation 160, the semiconductor layers 210A are removed by a selective etching process that is tuned to remove only the semiconductor layers 210A while the semiconductor layers 210B, the APT layer 206, and the inner spacers 230 remain substantially unchanged. The selective etching may be a selective wet etching, a selective dry etching, or a combination thereof. In some embodiments, the selective wet etching process may include a HF or $NH_4OH$ etchant. In some embodiments, the selective removal of semiconductor layers 210A may include an oxidation process (for example, to form oxidized semiconductor layers 210A comprising SiGeOx) followed by an oxidation removal (for example, SiGeOx removal).

As depicted in FIGS. 15B and 15C, a height in the Z-direction of the gap 258 between the APT layer 206 and the fin substrate 202' is equal to the height H1 of the first semiconductor layer 204, which is about 2 nm to about 10 nm. A height in the Z-direction of the space between the semiconductor layers 210B is equal to the height H3 of the semiconductor layers 210A, which is about 4 nm to about 15 nm. The height of the gap 258 (i.e., height H1) is less than the height of the space between the semiconductor layers 210B (i.e., height H3), such that during the later metal gate formation process, the gap 258 is filled with only dielectric material(s), without any conductive material, to ensure that the APT layer 206 is sufficiently isolate from the fin substrate 202' (i.e., the substrate 202). Accordingly, the epitaxial S/D features 240 can be isolated from the substrate to mitigate the junction leakage issue between the epitaxial S/D features. In some embodiments, the height H1 of the gap 258 is less than twice of the thickness of the gate dielectric (discuss below) in the gap 258, and the height H3 of the space between the semiconductor layers 210B is greater than twice of the thickness of the gate dielectric in the space between the semiconductor layers 210B.

Now referring to FIGS. 1 and 16A-16C, at operation 165, a metal gate stack 260 is formed in the gate trench 256. The metal gate stack 260 includes multiple layers, such as a gate interfacial layer 262 wrapping the semiconductor layers 210B, a gate dielectric layer 264 formed over the gate interfacial layer 262, a metal gate electrode 266 formed over the gate dielectric layer 264, other suitable layers, or combinations thereof. The gate interfacial layer 262 and the gate dielectric layer 264 collectively refer to as gate dielectric. The metal gate stack 260 wraps around each of the suspended semiconductor layers 210B in the channel region of the fin structure 216 and potions (gate dielectric) of the metal gate stack 260 fill the gap 258.

The gate interfacial layer 262 may include materials such as $SiO_2$, SION, HfSiO, other suitable materials, or combinations thereof. A deposition process may be performed to form the gate interfacial layer 220 wrapping around the suspended semiconductor layers 210B and APT layer 206. The deposition process includes CVD, PVD, ALD, HDPCVD, MOCVD, RPCVD, PECVD, LPCVD, ALCVD, APCVD, other suitable methods, or combinations thereof. In some embodiments, the gate interfacial layer 262 is only deposited on the Si material, not the dielectric material, such as the isolation structure 218. In some embodiments, a thickness of the gate interfacial layer 262 in the Z-direction is less than about 3 nm. In some embodiments, a thickness of the gate interfacial layer 262 disposed in the spaces between the semiconductor layers 210B is different than a thickness of the gate interfacial layer 262 in the gap 258 between the APT layer 206 and the fin substrate 202' (i.e., the substrate 202). For example, the thickness of the gate interfacial layer 262 in the space between the semiconductor layers 210B is about 0 nm to about 3 nm and in the gap 258 is about 0.5 nm to about 3 nm.

The gate dielectric layer 264 may be a high-k dielectric layer and include materials such as hafnium oxide ($HfO_2$), hafnium silicon oxide (HfSiO), hafnium zirconium oxide (HfZrO), zirconium oxide ($ZrO_2$), other suitable materials, or combinations thereof. The gate dielectric layer 264 is deposited over the gate interfacial layer 262 to wrap the suspended semiconductor layers 210B and APT layer 206 by a suitable deposition process, such as CVD, PVD, ALD, HDPCVD, MOCVD, RPCVD, PECVD, LPCVD, ALCVD, APCVD, plating, other suitable methods, or combinations thereof. In some embodiments, a thickness of the gate dielectric layer 264 disposed in the spaces between the semiconductor layers 210B is different than a thickness of the gate dielectric layer 264 in the gap 258 between the APT layer 206 and the fin substrate 202' (i.e., the substrate 202). For example, the thickness of the gate dielectric layer 264 in the space between the semiconductor layers 210B is about 1 nm to about 5 nm and in the gap 258 is about 1 nm to about 9 nm.

As depicted in FIGS. 16B and 16C, the height H3 of the space between the semiconductor layers 210B is greater than twice of the thickness of the gate dielectric (including the gate interfacial layer 262 and the gate dielectric layer 264) in the space between the semiconductor layers 210B, therefore after the deposition of the gate interfacial layer 262 and the gate dielectric layer 264, conductive materials (i.e. the metal gate electrode 266) is deposited and fills the space between the semiconductor layers 210B. However, the height H1 of the gap 258 is less than twice the sum of the thickness of the gate interfacial layer 262 and the thickness of the gate dielectric layer 264 in the gap 258, therefore the gate interfacial layer 262 and the gate dielectric layer 264 fill the gap 258 between the APT layer 206 and the fin substrate 202', and no room is left in the gap 258 after the deposition of the gate interfacial layer 262 and the gate dielectric layer 264. In some embodiments, during deposition, in gap 258, the gate dielectric layer 264 on opposite surfaces of the gate interfacial layer 262 merges together. The gate interfacial layer 262 and the gate dielectric layer 264 filling the gap 258 together are referred to as a substrate isolation layer 268. The substrate isolation layer 268 includes dielectric material(s) and isolates the APT layer 206 from the fin substrate 202' (i.e., the substrate 202), therefore reducing junction leakage and latch-up issues between the epitaxial S/D features 240 and improving performance of device 200. In some embodiments, as discussed above, in the space between the semiconductor layers 210B, the thickness of the gate interfacial layer 262 is about 0 nm to about 3 nm, and the thickness of the gate dielectric layer 264 is about 1 nm to about 5 nm. In the substrate isolation layer 268, the thickness of the gate interfacial layer 262 is about 0.5 nm to about 3 nm, and the thickness of the gate dielectric layer 264 is about 1 nm to about 9 nm. In some embodiments, in the substrate isolation layer 268, a thickness ratio of the gate interfacial layer 262 to the gate dielectric layer 264 is about 0.05 to about 3 depends on the height H1 of the gap 258, the deposition time of the gate interfacial layer 262 and the gate dielectric layer 264. The height of the substrate isolation layer 268 is about 2 nm to about 10 nm, and the height H3 of the space between the semiconductor layers 210B is about 4 nm to about 15 nm. In addition, since the first semiconductor layer 204 and the third semiconductor layers 210A comprise the same material, they can be removed and filled simultaneously. Thus, no extra step is needed for the isolation and the fabrication of the GAA device in the present disclosure is compatible with current GAA processing. Furthermore, in the present GAA device examples, bulk Si substrate can be used to realize the isolation, therefore, the fabrication cost can be reduced.

In some embodiments, the gate electrode 266 may comprise a work function metal layer formed over the gate dielectric layer 264 and a bulk conductive layer formed over the work function metal layer. The work function metal layer may include any suitable material, such as titanium nitride (TiN), tantalum nitride (TaN), ruthenium (Ru), molybdenum (Mo), tungsten (W), platinum (Pt), titanium (Ti), aluminum (Al), tantalum carbide (TaC), tantalum carbide nitride (TaCN), tantalum silicon nitride (TaSiN), titanium silicon nitride (TiSiN), other suitable materials, or combinations thereof. In some embodiments, the work function metal layer includes multiple material layers of the same or different types (i.e., both n-type work function metal or both p-type work function metal) in order to achieve a desired threshold voltage. The bulk conductive layer may include aluminum (Al), copper (Cu), tungsten (W), cobalt (Co), ruthenium (Ru), other suitable conductive materials, or combinations thereof. The metal gate stack 260 may include other material layers, such as a barrier layer, a glue layer, a hard mask layer, and/or a capping layer. The gate electrode 266 and various other layers of the metal gate stack 260 may be formed by any suitable method, such as CVD, ALD, PVD, plating, chemical oxidation, thermal oxidation, other suitable methods, or combinations thereof. As discussed above, the gate electrode 266 fills only the space between the semiconductor layers 210B and does not fill the gap 258 between the APT layer 206 and the fin substrate 202'. In other words, the substrate isolation layer 268 does not include conductive material (i.e., the gate electrode 266), and only includes dielectric material(s) (i.e. the gate interfacial layer 262 and/or the gate dielectric layer 264).

Thereafter, still at operation 165, one or more polishing process (for example, CMP) may be performed to remove any excess conductive materials and planarize the top surface of device 200.

Referring to FIGS. 1 and FIGS. 17A-17C, at operation 170, method 100 performs further processing to complete the fabrication of the device 200. For example, S/D contacts 270 may be formed as depicted in FIGS. 17A and 17C. In some embodiments, portions of the ILD layer 254 in the S/D regions may be removed to form contact openings in the S/D regions of device 200 such that the epitaxial features 240 are exposed through the contact openings. A conductive material is then filled in the S/D contact openings, and a CMP process may be performed to remove any excess conductive material to form the S/D contacts 270. Still at operation 170, other various contacts, vias, wires, and multilayer interconnect features (e.g., metal layers and interlayer dielectrics) may be formed over the substrate 202, configured to connect the various features to form a functional circuit that may include one or more multi-gate devices.

FIG. 18 provides a cross-sectional view in the C-C' plane of device 200 illustrating multiple gate structures in accordance with some embodiments of the present disclosure. The device 200 includes similar structures as those discussed in FIGS. 2A-2C to 17A-17C, but with multiple gate structures. For example, referring to FIG. 18, device 200 includes the substrate 202 and the fin substrate 202' formed by etching a top portion of the substrate 202. The fin substrate 202' has a first dopant concentration. The APT layer 206 is disposed over the fin substrate 202' and has a second dopant concentration that is greater than the first dopant concentration. The APT layer 206 is separated from the fin substrate 202' by the substrate isolation layer 268 comprising dielectric material(s). Device 200 further includes a nanostructure formed over the APT layer and including semiconductor layers 210B vertically separated from one another in the Z-direction. Metal gate stacks 260A, 260B, and 260C (all referred to as metal gate stacks 260) are formed parallel to each other and wrap each of the semiconductor layers 210B of the nanostructure in the channel regions. Each of the metal gate stacks 260A, 260B, and 260C includes the gate interfacial layer 262 wrapping the semiconductor layers 210B, the gate dielectric layer 264 disposed over the interfacial layer 262, and the gate electrode 266 disposed over the gate dielectric layer 264. The dielectric materials (i.e. the gate interfacial layer 262 and/or the gate dielectric layer 264) of the metal gate stacks 260 fill the substrate isolation layer 268 separating the APT layer 206 and the fin substrate 202'. Epitaxial S/D features 240A and 240B are disposed in the S/D regions of the nanostructure. S/D contacts 270A and 270B are disposed over and directly contact the epitaxial S/D features 240A and 240B, respectively. Gate spacers 226 are formed between the metal gate stacks 260 and the S/D contacts 270A, 207B. Inner spacers 230 are formed between the metal gate stacks 260 and the epitaxial S/D features 240A, 240B.

As illustrated in FIG. 18, the APT layer 206 and the substrate isolation layer 268 extend over the fin substrate 202' continuously in the X-direction without interruption under the gate stack 260A, the epitaxial S/D features 240A, the gate stack 260B, the epitaxial S/D features 240B, and the gate stack 260C. In other words, the APT layer 206 and the substrate isolation layer 268 separate the epitaxial S/D features 240A and 240B from the fin substrate 202' (i.e., substrate 202). Since the APT layer 260 has a greater dopant concentration (for example, $1\times10^{17}$ atoms/cm$^{-3}$ to about $1\times10^{20}$ atoms/cm$^{-3}$) than that of the fin substrate 202' (for example, $1\times10^{15}$ atoms/cm$^{-3}$ to about $1\times10^{19}$ atoms/cm$^{-3}$), and is separated from the fin substrate 202' by the substrate isolation layer 268, the junction leakage issues between the epitaxial S/D feature 240A and epitaxial S/D feature 240B are mitigated and the performance of device 200 is improved.

The present disclosure provides for many different embodiments. Semiconductor device having self substrate isolation and methods of fabrication thereof are disclosed herein. An exemplary semiconductor device includes a fin substrate having a first dopant concentration; an anti-punch through (APT) layer disposed over the fin substrate, wherein the APT layer has a second dopant concentration that is greater than the first dopant concentration; a nanostructure including semiconductor layers disposed over the APT layer; a gate structure disposed over the nanostructure and wrapping each of the semiconductor layers, wherein the gate structure includes a gate dielectric and a gate electrode; a first epitaxial source/drain (S/D) feature and a second epitaxial S/D feature disposed over the APT layer, wherein the gate structure is disposed between the first epitaxial S/D feature and the second epitaxial S/D feature; and an isolation layer disposed between the APT layer and the fin substrate, wherein a material of the isolation layer is the same as a material of the gate dielectric.

In some embodiments, the APT layer and the isolation layer extend without interruption under the first epitaxial S/D feature, the gate structure, and the second epitaxial S/D feature. In some embodiments, the gate dielectric and the isolation layer include an interfacial layer and a high-k dielectric layer. In some embodiments, a thickness of the isolation layer is less than a distance between two adjacent semiconductor layers of the semiconductor layers of the nanostructure. In some embodiments, a thickness of the isolation layer is less than twice a thickness of the gate dielectric. In some embodiments, the fin substrate is a first active region extending from a bulk substrate of the semiconductor device, the semiconductor device further comprising an isolation feature disposed over the bulk substrate, wherein the isolation feature separates the first active region from a second active region of the semiconductor device, wherein a top surface of the isolation feature is lower than a top surface of the isolation layer. In some embodiments, the semiconductor layers include a third dopant concentration, wherein the first dopant concentration of the fin substrate is greater than the third dopant concentration of the semiconductor layers of the nanostructure.

In some embodiments, the third dopant concentration of the semiconductor layers of the nanostructure is less than about $5 \times 10^{17}$ atoms/cm$^{-3}$. In some embodiments, the second dopant concentration of the APT layer is about $1 \times 10^{17}$ atoms/cm$^{-3}$ to about $1 \times 10^{20}$ atoms/cm$^{-3}$. In some embodiments, the first dopant concentration of the fin substrate is about $1 \times 10^{15}$ atoms/cm$^{-3}$ to about $1 \times 10^{19}$ atoms/cm$^{-3}$.

Another exemplary semiconductor device includes a fin structure having a first doped layer disposed over a second doped layer, wherein the first doped layer has a first dopant concentration and the second doped layer has a second dopant concentration, wherein the first dopant concentration is greater than the second dopant concentration; a high-k dielectric layer disposed in the fin structure between the first doped layer and the second doped layer; a first source/drain feature and a second source/drain feature disposed on the first doped layer; a semiconductor layer disposed over the first doped layer, wherein the semiconductor layer is further disposed between the first source/drain feature and the second source/drain feature; and a gate stack surrounding the semiconductor layer, such that a portion of the gate stack is disposed between the first doped layer and the semiconductor layer.

In some embodiments, a thickness of the high-k dielectric layer is less than a thickness of the portion of the gate stack disposed between the first doped layer and the semiconductor layer.

In some embodiments, the another exemplary semiconductor device further includes a dielectric layer disposed between the high-k dielectric layer and the first doped layer and between the high-k dielectric layer and the second doped layer, wherein the fin structure includes silicon, the dielectric layer includes silicon and oxygen, and the high-k dielectric layer includes hafnium and oxygen.

In some embodiments, the semiconductor layer is a first semiconductor layer, the semiconductor device further comprising a second semiconductor layer disposed over the first semiconductor layer and further disposed between the first source/drain feature and the second source/drain feature, wherein the gate stack surrounds the second semiconductor layer and is disposed between the first semiconductor layer and the second semiconductor layer.

An exemplary method includes forming a fin structure over a substrate, wherein the fin structure includes a first semiconductor layer, a second semiconductor layer over the first semiconductor layer, a third semiconductor layer over the second semiconductor layer, and a fourth semiconductor layer over the third semiconductor layer, wherein a thickness of the first semiconductor layer is less than a thickness of the third semiconductor layer and a doping concentration of the second semiconductor layer is greater than a doping concentration of the substrate; forming a dummy gate structure over a first region of the fin structure; removing the third semiconductor layer and the fourth semiconductor layer from a second region and a third region of the fin structure, wherein the first region is disposed between the second region and the third region; forming a first source/drain (S/D) feature and a second S/D feature over the second semiconductor layer respectively in the second region and the third region; removing the dummy gate structure to expose the first region of the fin structure; selectively removing the first semiconductor layer and the third semiconductor layer to form a first gap between the substrate and the second semiconductor layer and a second gap between the second semiconductor layer and the fourth semiconductor layer; forming a gate dielectric in the first gap and the second gap, wherein the gate dielectric fills the first gap, and further wherein the gate dielectric wraps the fourth semiconductor layer and partially fills the second gap; and forming a gate electrode over the gate dielectric in the second gap.

In some embodiments, forming the fin structure includes depositing the first semiconductor layer including a first material over the substrate; depositing the second semiconductor layer including a second material over the substrate; performing an implantation process on the second semiconductor layer; after the implantation process, depositing a third semiconductor layer including the first material over the second semiconductor layer; depositing a fourth semiconductor layer including the second material over the third semiconductor layer; and patterning the first, second, third, and fourth semiconductor layers to form the fin structure.

In some embodiments, forming the gate dielectric in the first gap and the second gap includes depositing a first dielectric material in the first and second gaps, wherein the first dielectric material wraps the second and fourth semiconductor layers in the first region; and depositing a second dielectric material over the first dielectric material in the first and second gaps, wherein the first and second dielectric materials fill the second gap.

In some embodiments, the method further includes doping the fourth semiconductor layer with a doping concentration less than the doping concentration of the second semiconductor layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   a base fin disposed over the substrate;
   an isolation structure disposed over the substrate and interfacing sidewalls of the base fin;
   an isolation layer disposed over the base fin;
   a doped semiconductor layer over the isolation layer;
   a first source/drain feature and a second source/drain feature disposed over the doped semiconductor layer;
   a plurality of nanostructures disposed over the doped semiconductor layer and extending between the first source/drain feature and the second source/drain feature; and
   a gate structure wrapping around each of the plurality of nanostructures and disposed over the doped semiconductor layer.

2. The semiconductor device of claim 1, wherein the doped semiconductor layer and the isolation layer extend without interruption under the first source feature, the gate structure, and the second source/drain feature.

3. The semiconductor device of claim 1, wherein the isolation layer comprises:
   a first interfacial dielectric layer over the base fin;
   a high-k dielectric layer over the first interfacial dielectric layer; and
   a second interfacial dielectric layer over the high-k dielectric layer.

4. The semiconductor device of claim 3,
   wherein the first interfacial dielectric layer and the second interfacial dielectric layer comprise silicon oxide, silicon oxynitride, or hafnium silicate,
   wherein the high-k dielectric layer comprises the isolation layer comprises hafnium oxide, hafnium silicon oxide, hafnium zirconium oxide, or zirconium oxide.

5. The semiconductor device of claim 1,
   wherein the base fin and the doped semiconductor layer comprise a dopant,
   wherein the base fin comprises a first dopant concentration,
   wherein the doped semiconductor layer comprises a second dopant concentration greater than the first dopant concentration.

6. The semiconductor device of claim 1, wherein the first source/drain feature and the second source/drain feature directly contact the doped semiconductor layer.

7. The semiconductor device of claim 1, further comprising:
   a plurality of inner spacer features interleaving the plurality of nanostructures,
   wherein the gate structure is spaced apart from the first source/drain feature by the plurality of inner spacer features.

8. The semiconductor device of claim 7, wherein the plurality of inner spacer features comprise silicon oxide, silicon oxynitride, silicon nitride, silicon carbonitride, silicon oxycarbide, silicon oxycarbonitride, or combinations thereof.

9. A semiconductor structure, comprising:
   a base fin disposed in an isolation structure;
   an isolation layer disposed over the base fin;
   a doped semiconductor layer over the isolation layer;
   a source/drain feature disposed over the doped semiconductor layer;
   a plurality of nanostructures disposed over the doped semiconductor layer and extending horizontally from a sidewall of the source/drain feature;
   a gate structure wrapping around each of the plurality of nanostructures; and
   a gate spacer layer disposed over the isolation structure and extending continuously along sidewalls of the isolation layer, the doped semiconductor layer, and a portion of the source/drain feature.

10. The semiconductor structure of claim 9, wherein the isolation layer is sandwiched between a top surface of the base fin and the doped semiconductor layer.

11. The semiconductor structure of claim 9, wherein the doped semiconductor layer and the isolation layer extend without interruption under the source feature and the gate structure.

12. The semiconductor structure of claim 9, wherein the isolation layer comprises:
    a first interfacial dielectric layer over the base fin;
    a high-k dielectric layer over the first interfacial dielectric layer; and
    a second interfacial dielectric layer over the high-k dielectric layer.

13. The semiconductor structure of claim 12,
    wherein the first interfacial dielectric layer and the second interfacial dielectric layer comprise silicon oxide, silicon oxynitride, or hafnium silicate,
    wherein the high-k dielectric layer comprises the isolation layer comprises hafnium oxide, hafnium silicon oxide, hafnium zirconium oxide, or zirconium oxide.

14. The semiconductor structure of claim 9,
    wherein the base fin and the doped semiconductor layer comprise a dopant,
    wherein the base fin comprises a first dopant concentration,
    wherein the doped semiconductor layer comprises a second dopant concentration greater than the first dopant concentration.

15. The semiconductor structure of claim 9, wherein the gate spacer layer comprises silicon oxide, silicon oxynitride, silicon nitride, silicon carbonitride, silicon oxycarbide, silicon oxycarbonitride, or combinations thereof.

16. A semiconductor structure, comprising:
    a substrate;
    a base fin over the substrate;
    an isolation structure disposed over the substrate and interfacing sidewalls of the base fin;
    an isolation layer disposed over the base fin;
    a doped semiconductor layer over the isolation layer;
    a first source/drain feature and a second source/drain feature disposed over the doped semiconductor layer;

a plurality of nanostructures disposed over the doped semiconductor layer and extending between the first source/drain feature and the second source/drain feature; and a gate structure wrapping around each of the plurality of nanostructures and disposed over the doped semiconductor layer, wherein a thickness of the isolation layer is smaller than a distance between two adjacent ones of plurality of the nanostructures.

17. The semiconductor structure of claim 16, wherein the base fin and the doped semiconductor layer comprise a dopant, wherein the base fin comprises a first dopant concentration, wherein the doped semiconductor layer comprises a second dopant concentration greater than the first dopant concentration.

18. The semiconductor structure of claim 16, wherein the isolation layer comprises:

a first interfacial dielectric layer over the base fin;

a high-k dielectric layer over the first interfacial dielectric layer; and a second interfacial dielectric layer over the high-k dielectric layer.

19. The semiconductor structure of claim 18, wherein the first interfacial dielectric layer and the second interfacial dielectric layer comprise silicon oxide, silicon oxynitride, or hafnium silicate, wherein the high-k dielectric layer comprises the isolation layer comprises hafnium oxide, hafnium silicon oxide, hafnium zirconium oxide, or zirconium oxide.

20. The semiconductor structure of claim 16, wherein the thickness of the isolation layer is between about 2 nm and about 10 nm.

* * * * *